US011437504B2

(12) United States Patent
Then et al.

(10) Patent No.: US 11,437,504 B2
(45) Date of Patent: Sep. 6, 2022

(54) COMPLEMENTARY GROUP III-NITRIDE TRANSISTORS WITH COMPLEMENTARY POLARIZATION JUNCTIONS

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 16/643,926

(22) PCT Filed: Sep. 29, 2017

(86) PCT No.: PCT/US2017/054380
§ 371 (c)(1),
(2) Date: Mar. 3, 2020

(87) PCT Pub. No.: WO2019/066916
PCT Pub. Date: Apr. 4, 2019

(65) Prior Publication Data
US 2020/0411677 A1 Dec. 31, 2020

(51) Int. Cl.
*H01L 29/778* (2006.01)
*H01L 29/66* (2006.01)
(Continued)

(52) U.S. Cl.
CPC ...... *H01L 29/7786* (2013.01); *H01L 27/0605* (2013.01); *H01L 27/092* (2013.01);
(Continued)

(58) Field of Classification Search
None
See application file for complete search history.

(56) References Cited

U.S. PATENT DOCUMENTS 4,216,036 A 8/1980 Tsang
6,630,695 B2 10/2003 Chen et al.
(Continued)

FOREIGN PATENT DOCUMENTS

JP 2011049488 3/2011
KR 20140026486 3/2014
(Continued)

OTHER PUBLICATIONS

Nakajima, A. "GaN-based complementary metal-oxide-semiconductor inverter with normally off Pch and Nch MOSFETs fabricated using polarisation-induced holes and electron channels" IET Power Elec. Spec. Iss. Sel. Pap. 13th Int. Sem. on Pow. Semi. vol. 11, Iss. 4 Feb. 23, 2018 pp. 689-694 (Year: 2018).*
(Continued)

*Primary Examiner* — Grant S Withers
(74) *Attorney, Agent, or Firm* — Essential Patents Group, LLP

(57) ABSTRACT

Group III-N transistors of complementary conductivity type employing two polarization junctions of complementary type. Each III-N polarization junction may include two III-N material layers having opposite crystal polarities. The opposing polarities may induce a two-dimensional charge sheet within each of the two III-N material layers. Opposing crystal polarities may be induced through introduction of an intervening layer between two III-N material layers. A III-N heterostructure may include two III-N polarization junctions. A 2D electron gas (2DEG) is induced at a first polarization junction and a 2D hole gas (2DHG) is induced at the second polarization junction. Transistors of complementary type may utilize a separate one of the polarization junctions, enabling III-N transistors to implement CMOS circuitry.

20 Claims, 18 Drawing Sheets

(51) Int. Cl.
  *H01L 27/06* (2006.01)
  *H01L 27/092* (2006.01)
  *H01L 29/20* (2006.01)

(52) U.S. Cl.
  CPC ...... *H01L 27/0922* (2013.01); *H01L 29/2003* (2013.01); *H01L 29/66462* (2013.01); *H01L 29/7787* (2013.01)

(56) References Cited

U.S. PATENT DOCUMENTS

| | | | |
|---|---|---|---|
| 8,021,904 B2 | 9/2011 | Chitnis | |
| 8,718,110 B2 | 5/2014 | Kyono et al. | |
| 2005/0098835 A1 | 5/2005 | Ushiroda et al. | |
| 2006/0124960 A1* | 6/2006 | Hirose | H01L 27/1203 257/189 |
| 2007/0194330 A1 | 8/2007 | Ibbetson et al. | |
| 2008/0185608 A1 | 8/2008 | Chitnis | |
| 2010/0059781 A1 | 3/2010 | Yokobayashi et al. | |
| 2010/0187550 A1 | 7/2010 | Reed et al. | |
| 2010/0327322 A1 | 12/2010 | Kub et al. | |
| 2011/0012109 A1 | 1/2011 | Kryliouk et al. | |
| 2011/0159669 A1 | 6/2011 | Yang et al. | |
| 2011/0233602 A1 | 9/2011 | Hwang | |
| 2012/0007097 A1 | 1/2012 | Hebert | |
| 2012/0012869 A1 | 1/2012 | Song | |
| 2012/0211801 A1 | 8/2012 | Hashimoto et al. | |
| 2012/0322189 A1 | 12/2012 | Nakada et al. | |
| 2013/0026489 A1 | 1/2013 | Gambin et al. | |
| 2013/0075824 A1 | 3/2013 | Fukushima et al. | |
| 2013/0221409 A1 | 8/2013 | Nakajima et al. | |
| 2014/0264380 A1* | 9/2014 | Kub | H01L 21/0262 257/77 |
| 2016/0300835 A1* | 10/2016 | Xia | H01L 29/66734 |
| 2016/0351564 A1* | 12/2016 | Azize | H01L 29/66621 |
| 2017/0018639 A1* | 1/2017 | Teo | H01L 21/8258 |
| 2017/0243866 A1* | 8/2017 | Then | H01L 27/092 |
| 2018/0026156 A1 | 1/2018 | Zhang et al. | |
| 2018/0076291 A1* | 3/2018 | Koyama | H01L 29/7786 |
| 2018/0350944 A1* | 12/2018 | Huang | H01L 21/8252 |
| 2020/0357742 A1* | 11/2020 | Then | H01L 29/78 |
| 2020/0411678 A1* | 12/2020 | Radosavljevic | H01L 29/78681 |
| 2021/0343703 A1* | 11/2021 | Palacios | H01L 27/0605 |

FOREIGN PATENT DOCUMENTS

| | | |
|---|---|---|
| WO | 2013101184 | 7/2013 |
| WO | 2016209263 | 12/2016 |
| WO | 2017153906 | 9/2017 |

OTHER PUBLICATIONS

Chu, R. "An Experimental Demonstration of GaN CMOS Technology" IEEE Electron Device Letters, vol. 37, No. 3, Mar. 2016 pp. 269-271 (Year: 2016).*

Hahn, H. "First Monolithic Integration of GaN-Based Enhancement Mode n-Channel and p-Channel Heterostructure Field Effect Transistors" 72nd Device Research Conference Jul. 8, 2014 pp. 259-260 (Year: 2014).*

International Search Report and Written Opinion from PCT/US2017/054380 dated Jun. 15, 2018, 16 pgs.

International Preliminary Report on Patentability from PCT/US2017/054380 dated Apr. 9, 2020, 13 pgs.

* cited by examiner

COMPLEMENTARY GROUP III-NITRIDE TRANSISTORS WITH COMPLEMENTARY POLARIZATION JUNCTIONS

CLAIM OF PRIORITY

This Application is a National Stage Entry of, and claims priority to, PCT Application No. PCT/US2017/054380, filed on Sep. 29, 2017 and titled "COMPLEMENTARY GROUP III-NITRIDE TRANSISTORS WITH COMPLEMENTARY POLARIZATION JUNCTIONS", which is incorporated by reference in its entirety for all purposes.

Many advanced semiconductor devices in development leverage non-silicon semiconductor materials, including compound semiconductor materials (e.g., GaAs, InP, InGaAs, InAs, and III-N materials). III-N materials, as well as other materials with wurtzite crystallinity, show particular promise for high voltage and high frequency applications like power management ICs and RF power amplifiers. III-N transistors, such as high electron mobility transistors (HEMTs) and metal oxide semiconductor (MOS) HEMTs typically employ a semiconductor heterostructure with one or more heterojunction, for example at an interface of a GaN semiconductor and another III-N semiconductor alloy, such as AlGaN or AlInN. GaN-based transistors benefit from a relatively wide bandgap (~3.4 eV), enabling higher breakdown voltages than Si-based MOSFETs, as well as high carrier mobility.

GaN n-channel transistors employ 2D electron gas (2DEG). GaN p-channel transistors can employ a 2D hole gas (2DHG), but to date, p-type III-N transistors face a number of challenges. One challenge is achieving high p-doping in III-N source and drain materials. Acceptor concentrations in InGaN, for example, have been limited to only about $5 \times 10^{17}/cm^3$. Such relatively low doping in a source and drain of a P-type transistor can result in high source and drain contact resistance, and/or a high resistance between the source and drain and the 2DHG. Furthermore, dealing with material stacks capable of hosting both a 2DEG and 2DHG on one substrate makes integration of N-type and P-type III-N transistors problematic. The ability to fabricate high performance III-N transistors having complementary conductivity types would advantageously enable III-N implementations of CMOS circuits including logic, digital, and analog circuitries a wide range of operating voltages.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
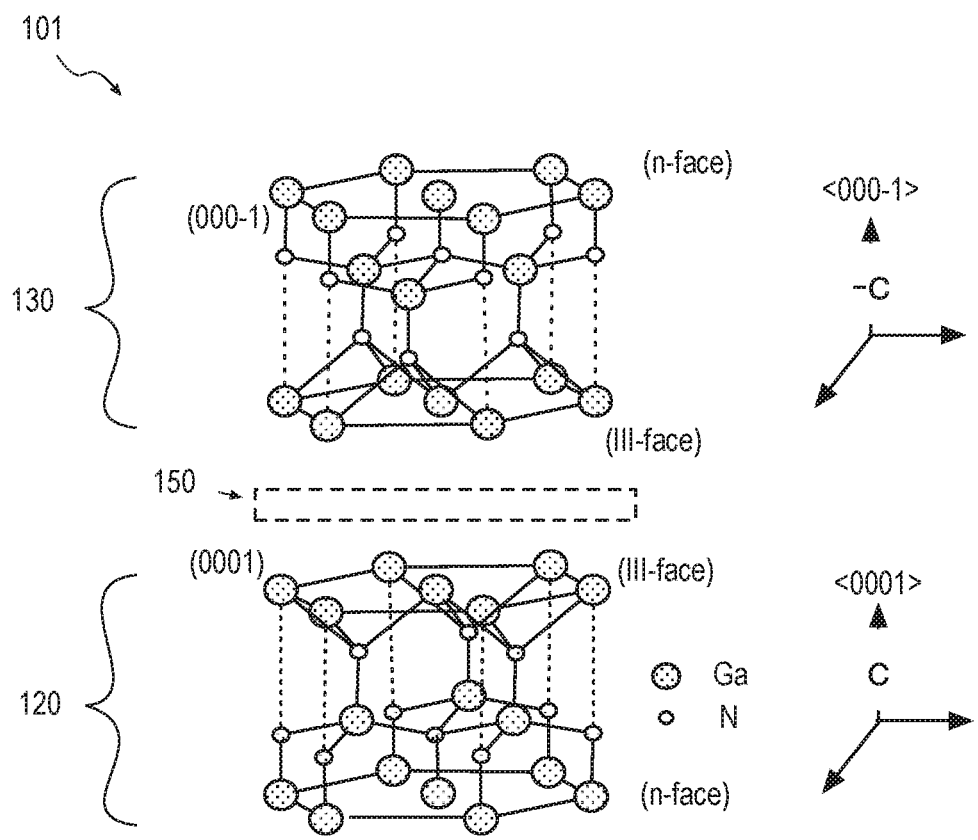
FIG. 1 is an isometric illustration showing crystal polarity inversion at a N-type III-N polarization junction, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "above," "under," "below," "between," and "on" as used herein refer to a relative position of one component or material with respect to other components or materials where such physical relationships are noteworthy. For example in the context of materials, one material or material over/above or under/below another may be directly in contact or may have one or more intervening materials. Moreover, one material between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A. B and C.

Integrated circuit (IC) structures including both N-type and P-type III-N transistors are described herein. The IC structures employ complementary II-N polarization junctions, which may be incorporated into one material stack. As described further below, a III-N heterostructure that includes a plurality of III-N material layers, or lamella, of different crystal polarities may be employed to fabricate III-N transistors of complementary conductivity types. Transistors of a first conductivity type (e.g., P-type) include a polarity inversion between a first layer of III-N material and a second layer of III-N material. The first and second III-N material layers may be separated by an intervening layer that facilitates the polarity inversion. The polarity inversion may induce a first two-dimensional charge carrier sheet of a first type (e.g., a two dimensional hole gas or "2DHG") within each of the first and second layers of III-N material, for example near their interface with the intervening layer. Transistors of a complementary type (e.g., N-type) further include a second polarity inversion between two layers of III-N material, such as a third layer of III-N material and the second layer of III-N material. The second and third III-N material layers may be separated by a second intervening layer that facilitates the second polarity inversion. The second polarity inversion may induce a first two-dimensional charge carrier sheet of the complementary type (e.g., a two dimensional electron gas or "2DEG") within each of the second and third layers of III-N material, for example near their interface with the second intervening layer. The complementary charge carrier sheets at the polarization junctions are dependent upon the spontaneous and piezo-electric polarization of the III-N material layers and are additive, resulting in very high carrier densities. Hence, with multiple polarization junctions, integrated circuitry with both N-type and P-type III-N transistors may exceed that of other integrated (e.g., CMOS) architectures implemented in a III-N material system.

In some embodiments, a III-N PMOS transistor employs a highly doped (e.g., $2e20/cm^3$) N-type source and drain, which allows current to be conducted through electrons up to the point where a tunnel junction injects the electrons into the 2DHG. Such a transistor architecture does not require p-doped raised source-drain, eliminating the need to introduce P-type dopants into an III-N IC structure. This may avoid the problems of poor source or drain contact resistance, and poor coupling to the 2DHG. The use of an N-type source and drain in the P-type device may also facilitate integration of the P-type device with an N-type device.

Figure 2:
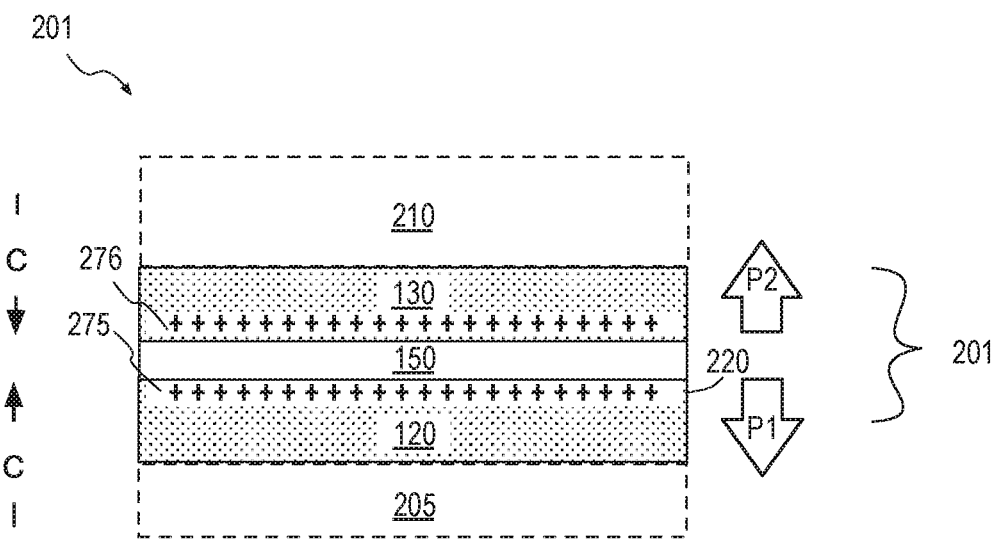
FIG. 2 is a cross-sectional view of the III-N polarization junction shown in FIG. 1, in accordance with some embodiments.

FIG. 1 is an isometric illustration showing crystal polarity inversion of a III-N polarization junction 101, in accordance with some embodiments. FIG. 2 is a cross-sectional view of polarization structure 101, in accordance with some embodiments. As shown in FIG. 1, polarization junction 101 includes a first Group III-nitride (III-N) material layer 120, an intervening layer 150, and a second III-N material layer 130. Although illustrated as a vertical stack of layers for the sake of simplification, it is noted that equivalent references may be made to laterally (horizontally spaced) arranged III-N materials. III-N material layer 120 may be any III-N material, such as a binary alloy (e.g., GaN, AlN, InN), a ternary alloy (e.g., $Al_xIn_{1-x}N$, $In_xGa_{1-x}N$, or $Al_xGa_{1-x}N$), or quaternary alloy (e.g., $In_xGa_yAl_{1-x-y}N$). III-N material layer 130 may likewise be any III-N material. In some embodiments, III-N material layer 130 has the same composition as III-N material layer 120. In other embodiments, III-N material layer 130 has a composition distinct from III-N material layer 120. III-N material layer 130 may be, for example, a binary alloy (e.g., GaN, AlN, InN), a ternary alloy (e.g., $Al_xIn_{1-x}N$, $In_xGa_{1-x}N$, or $Al_xGa_{1-x}N$), or quaternary alloy (e.g., $In_xGa_yAl_{1-x-y}N$). In some advantageous embodiments, I-N material layers 120 and 130 are intrinsic and not intentionally doped with impurities associated with a particular conductivity type. Intrinsic impurity (e.g., Si) levels in III-N material layers 120 and 130 may be advantageously less than 1e17 atoms/cm, and in some exemplary embodiments is between 1e14 and 1e16 atoms/cm$^3$. In some of these embodiments, III-N material layers 120 and 130 are both intrinsic binary GaN (i-GaN).

III-N material layers 120 and 130 may each have monocrystalline microstructure (e.g., hexagonal Wurtzite). Although monocrystalline, it is noted that crystal quality of the III-N crystal may vary dramatically, for example as a function of the techniques employed to form material layers 120 and 130. In some exemplary embodiments, dislocation density with III-N material layers 120 and 130 is in the range of $10^6$-$10^{11}$/cm$^2$. FIG. 1 illustrates crystal orientations of III-N material layers, 120 and 130, in accordance with some embodiments. The crystal structure of III-N material layer 120 lacks inversion symmetry, as does the crystal structure of III-N material layer 130. As shown, III-N material layer 120 has a polar group III (e.g., Ga)-face and a polar nitrogen (N)-face. Higher order planes may be semi-polar. The (0001) and (000-1) planes are not equivalent. Relative to a plane of intervening layer 150, III-N material layer 120 may be characterized as having +c polarity with the c-axis extending in the <0001> direction that is out of the plane of intervening layer 150, and/or of an underlying substrate (not depicted). The orientation of III-N material layer 120 may therefore be referred as Group III-face, or III-face III-N, or (000-1) III-N, or as having Group III-polarity (+c). The crystal orientation of III-N material layer 130 is inverted relative to that of III-N material layer 120, and may be characterized has having −c polarity with the c-axis extending in the <000-1> direction out of the plane intervening layer 150, and/or of an underlying substrate. The orientation of III-N material layer 130 may therefore be referred as N-face, (e.g., N-face III-N), or as (000-1) III-N, or as having N-polarity (−c).

As further illustrated in FIG. 2, because the crystal orientation, or crystal polarity, of III-N material layer 130 is inverted with respect to that of III-N material layer 120, the c-axes of III-N material layers 120 and 130 are aligned substantially anti-parallel. Although illustrated as anti-parallel, it is noted that the crystal orientations of material layers 120 and 130 may vary by 5-10° from an anti-parallel target as a result of processing conditions, and the impact of such misalignment of the crystals may merely be a slight reduction in polarization field strength. The junction between III-N material layers 120 and 130 is referred to herein as a "polarization junction" for at least the reason that crystals of different polarization or polarity meet (e.g., at their interface with intervening layer 150). III-N material layer 120 is associated with a polarization field strength $P_1$ that is a function of spontaneous and/or piezoelectric polarization field strength for the selected II-N alloy composition. III-N material layer 130 is likewise associated with a polarization field strength $P_2$ that is a function of spontaneous and/or piezoelectric polarization field strength for the selected III-N alloy composition. Because of the anti-parallel polarities of III-N material layer 120 and III-N material layer 130, two dimensional charge carrier (hole) sheets 275 and 276 are formed within at least a portion of II-N material layers 220, 230 proximal to their interface (e.g., proximal to intervening material layer 150). Notably, because of the anti-parallel crystal polarities, the two dimensional charge carrier sheets 275 and 276 are induced by a summation of the polarization field strengths P1 and P2. This is in contrast to a charge carrier gas that may be induced as a result of differences between the polarization field strengths of two different III-N compositions at a heterojunction having a single crystal polarity. Hence, in some exemplary embodiments where III-N material layers 120 and 130 have the same composition (e.g., both are i-GaN), polarization field strength P1 is equal to polarization field strength P2 (i.e., P1=P2). Following Maxwell's equations, the two dimensional charge carrier sheets 175 and 176 are then are result of a field equal to +P2+P2, or 2*P2. Thus, very high charge carrier densities may be present within a few nanometers on either side of polarization junction 201.

The relative crystal orientations shown in FIGS. 1 and 2 induce positive charge carrier sheets 275, 276. Because the anti-parallel polarization fields of III-N material layers 120, 130 point away from polarization junction 101, the resultant polarization doping is P-type. Polarization junction 101 (FIG. 1) may therefore be referred to as a P-type polarization junction. Positive charge carrier sheets 275, 276 (FIG. 2) may also be referred to as two-dimensional hole gases (2DHG). These 2DHGs are the result of III-N material layer 120 having the polar Group III-face (e.g., Ga-face) adjacent to intervening layer 150 and the polar N-face opposite, or distal to, intervening material layer 150. III-N material layer 130 also has the Group III-face (e.g., a Ga-face) adjacent to intervening layer 150, and the nitrogen (N)-face opposite, or distal to, intervening material layer 150. Positive charge carrier sheets 275, 276 may be proximal (e.g., with 2-4 nm) to the interface of intervening material layer 150. In some such embodiments III-N material layer 130 therefore has a thickness of at least 3 nm, and may be less than 10 nm.

Intervening material layer 150 may be any material or materials suitable for facilitating the formation of polarization junction 101. For example, in some embodiments intervening layer 150 includes a material that facilitates a crystal polarity inversion during an epitaxial growth of III-N material layer 130. For such embodiments, intervening layer 150 may be (mono)crystalline. As another example, in some embodiments intervening material layer 150 includes a material that facilitates a bonding of III-N material layer 130 to III-N material layer 120. For such embodiments, intervening layer 150 may be monocrystalline, polycrystalline, or amorphous. In some amorphous or (poly)crystalline embodiments, intervening material layer 150 is a discontinuous film layer that comprises islands of amorphous or (poly)crystalline material dispersed over the surface of III-N material layer 130. Intervening material layer 150 may have any suitable thickness (e.g., along the c-axis). In some embodiments, intervening material layer 150 has a thickness not more than 5 nm, and advantageously not more than 3 nm. In an embodiment, intervening material layer 150 is a crystalline material including less than 10, advantageously less than 7, and potentially even less than 5 monolayers.

In some exemplary crystalline embodiments, intervening material layer 150 has other than hexagonal crystallinity (i.e., crystallinity other than that of III-N material layers 120, 130). In some examples, intervening material layer 150 may have trigonal crystallinity. In some other examples, intervening material layer 150 may have cubic crystallinity. Having crystallinity other than that of the III-N material system may advantageously facilitate polarity inversion while still providing a crystalline seeding surface that can maintain monocrystallinity of III-N material layer 130, for example. In some exemplary embodiments, intervening layer 150 comprises other than a III-N material (e.g., other than a binary, ternary or quaternary III-N alloy). Intervening layer 150 may, for example, include one or more of oxygen, a metal, or a metalloid. The metal may more specifically be a rare earth, a lanthanide, a transition metal, or a post-transition (e.g., group III) metal. In some exemplary embodiments, intervening layer 150 is, or includes, aluminum oxide ($Al_xO_y$). In some such embodiments, intervening layer 150 is crystalline aluminum oxide (e.g., sapphire). In some other embodiments, intervening material layer 150 is, or includes, scandium oxide ($Sc_xO_y$). In some other embodiments, intervening material layer 150 is, or includes, scandium nitride ($Sc_xN_y$) material, aluminum oxy-nitride (AlNO), or scandium oxy-nitride (ScNO). In some such embodiments, intervening layer 150 is crystalline scandium oxide. In still other embodiments, intervening material layer 150 is, or includes, a mixed metal alloy, such as, but not limited to, aluminum scandium oxide.

Although in some embodiments, intervening material layer 150 is in direct contact with both III-N material layer 120 and III-N material layer 130, one or more material layers may also separate intervening material layer 150 from III-N material layer 120 and/or from intervening material layer 130. For example, intervening material layer 150 may be within a stack of material layers separating III-N material layer 120 from III-N material layer 130. In some embodiments, intervening material layer 150 is in contact with (e.g., on or under) a (mono)crystalline aluminum nitride (AlN) layer, or other crystalline III-N material suitable as an epitaxial nucleation layer. For example, intervening material layer 150 may be an oxide of an underlying AlN layer, or an oxide of an overlying AlN layer. In either case, intervening material layer 150 may be predominantly $Al_xO_y$. Intervening material layer 150 may also be between two (mono)crystalline AlN layers. For example, intervening material layer 150 may be a layer of aluminum oxide located between a first and a second (mono)crystalline aluminum nitride layer.

In some amorphous or (poly)crystalline embodiments, intervening material layer 150 is, or includes, one or more of, aluminum oxide, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate.

As further illustrated in FIG. 2, polarization junction 201 may be over any underlying substrate layer 205. Substrate layer 205 may vary with implementation. Substrate layer 205 is illustrated in dashed line as embodiments are not limited in this context. Polarization junction 201 may be under any overlying layer 210. Embodiments are not limited in this context, and therefore layer 310 is illustrated in dashed line.

Figure 3:
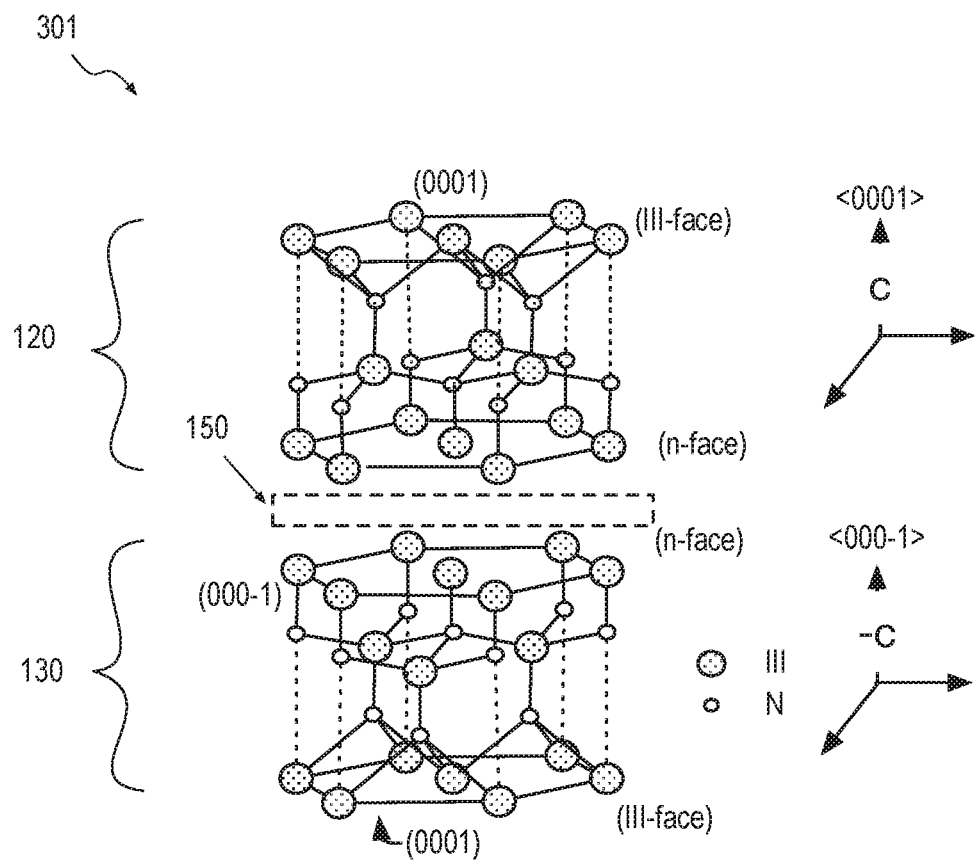
FIG. 3 is an isometric illustration showing crystal polarity inversion at a P-type III-N polarization junction, in accordance with some embodiments.
Figure 4:
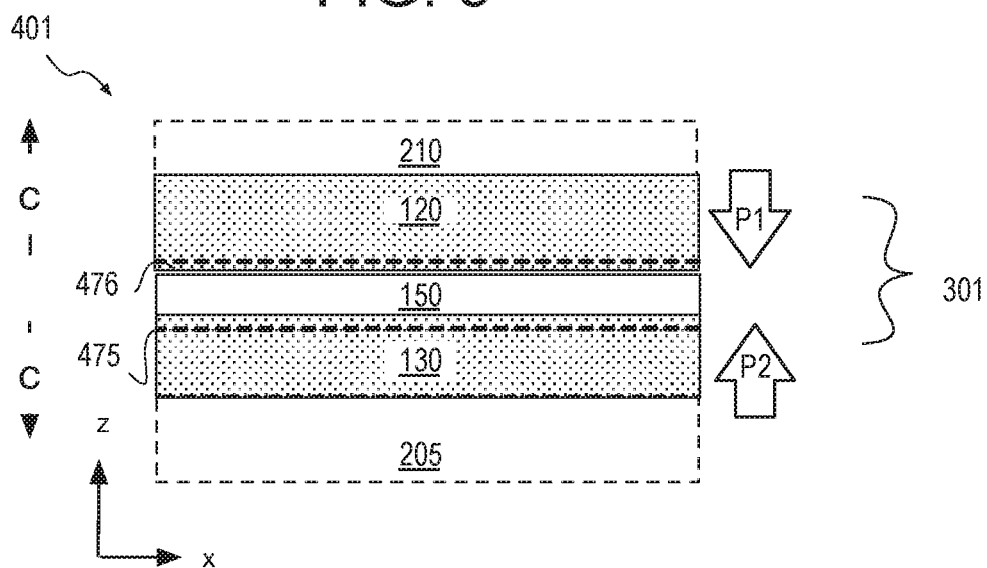
FIG. 4 is a cross-sectional view of the III-N polarization junction shown in FIG. 3, in accordance with some embodiments.

FIG. 3 is an isometric illustration showing crystal polarity inversion at a III-N polarization junction 301, in accordance with some embodiments. FIG. 4 is a cross-sectional view of II-N polarization junction 301, in accordance with some embodiments. As shown in FIGS. 3 and 4, polarization junction 301 includes the III-N material layers 120, and 130 with intervening layer 150 again located between these layers. The reference numbers introduced in the context of FIG. 1 and FIG. 2 are retained in FIG. 3 and FIG. 4 for material layers that may have any of the properties described above for material layers of polarization junction 101. Polarization junction 301 is however a N-type polarization junction with two dimensional (2D) charge carrier sheets 475 and 476 being high-density two-dimensional electron gases (2DEG). Negative charge carrier sheets 475 and 476 may be proximal (e.g., with 2-4 nm) of the interface of intervening material layer 150. The 2DEGs are the result of III-N material layers 120 and 130 having positions swapped relative to those introduced in the context of FIGS. 1 and 2.

Thus, in FIGS. 3 and 4, III-N material layer 120 has the N-face adjacent to intervening layer 150 and the Group III face (e.g., Ga-face) opposite, or distal to, intervening material layer 150. III-N material layer 130 also has the N-face adjacent to intervening layer 150, and the Group III-face (e.g., a Ga-face) opposite, or distal to, intervening material layer 150. III-N material layer 120 is again associated with polarization field strength $P_1$ that is a function of spontaneous and/or piezoelectric polarization field strength for the selected III-N alloy composition. III-N material layer 130 is likewise associated with polarization field strength $P_2$. Because of the substantially anti-parallel polarities of III-N material layer 120 and III-N material layer 130, two dimensional charge carrier sheets 475 and 476 are formed within at least a portion of III-N material layers 120, 130 proximal to their interface (e.g., proximal to intervening material layer 150). Notably, the two dimensional charge carrier sheets 475 and 476 are induced by a summation of the polarization field strengths P1 and P2. In some exemplary embodiments where III-N material layers 120 and 130 have the same composition (e.g., both are i-GaN), polarization field strength P1 is equal to polarization field strength P2 (i.e., P1=P2). Following Maxwell's equations, the two dimensional charge carrier sheets 475 and 476 are then the result of a field equal to +P2+P2, or 2*P2. Thus, because the anti-parallel polarization fields of III-N material layers 120, 130 point toward polarization junction 301, the resultant polarization doping is complementary to that associated with polarization junction 101 (FIG. 2). Intervening material layer 150 may be any of the materials described above. Polarization junction 301 may also be over any underlying substrate layer 205. Polarization junction 301 may likewise be under any overlying layer 210.

In some embodiments, the polarization junctions described above are both incorporated into an IC structure. As described further below, the IC structure may include transistors of complementary conductivity type that employ one or the other of the polarization junctions. In some such embodiments, the IC structure is fabricated in a substrate that includes a stack of material layers, and more specifically includes the material layers of a first polarization junction over the material layers of a second polarization junction.

Figure 5A:
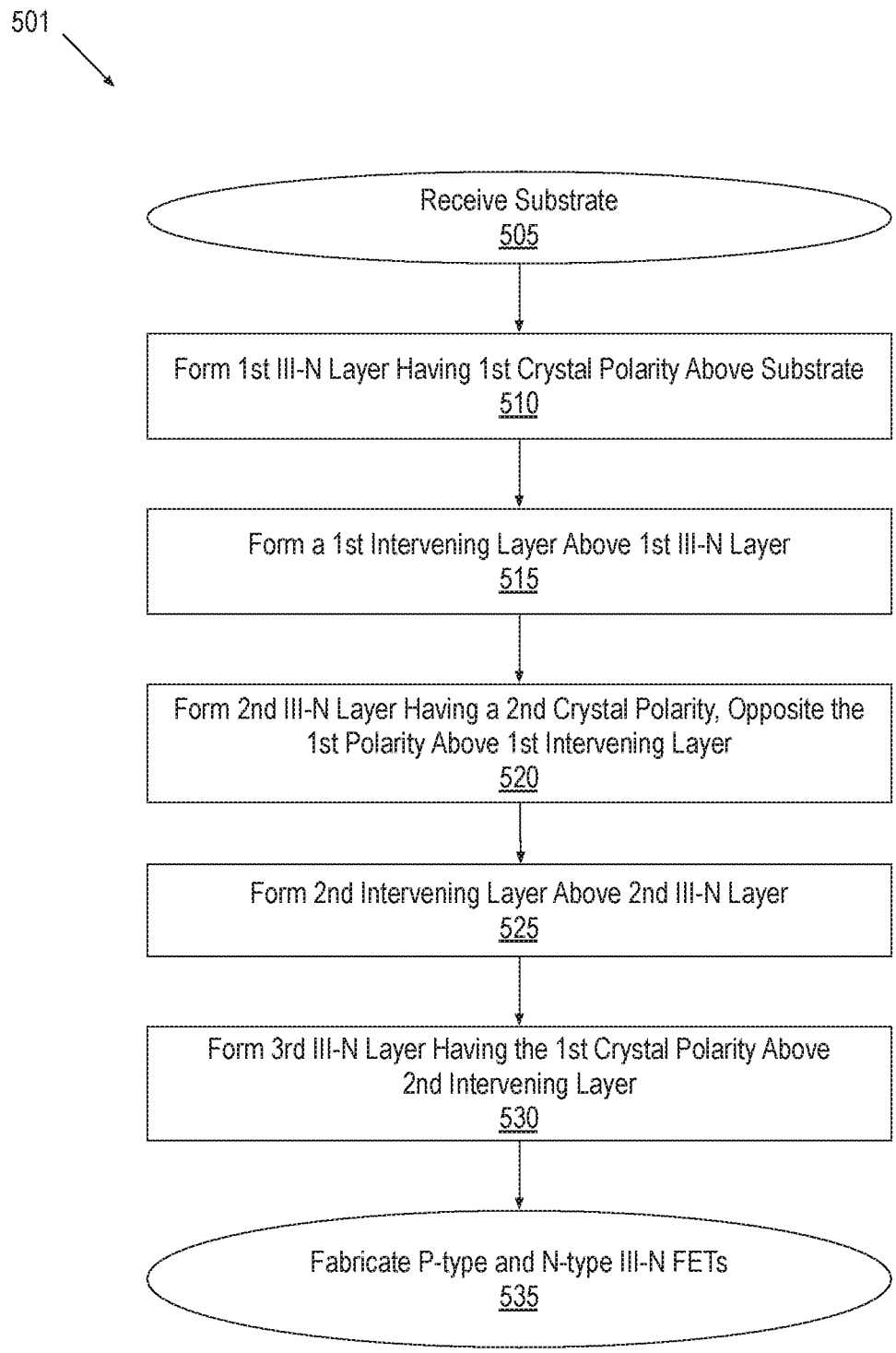
FIG. 5A is a flow diagram illustrating methods of forming a substrate including the III-N polarization junctions illustrated in FIG. 1 and FIG. 2, in accordance with some embodiments.
Figure 6A:
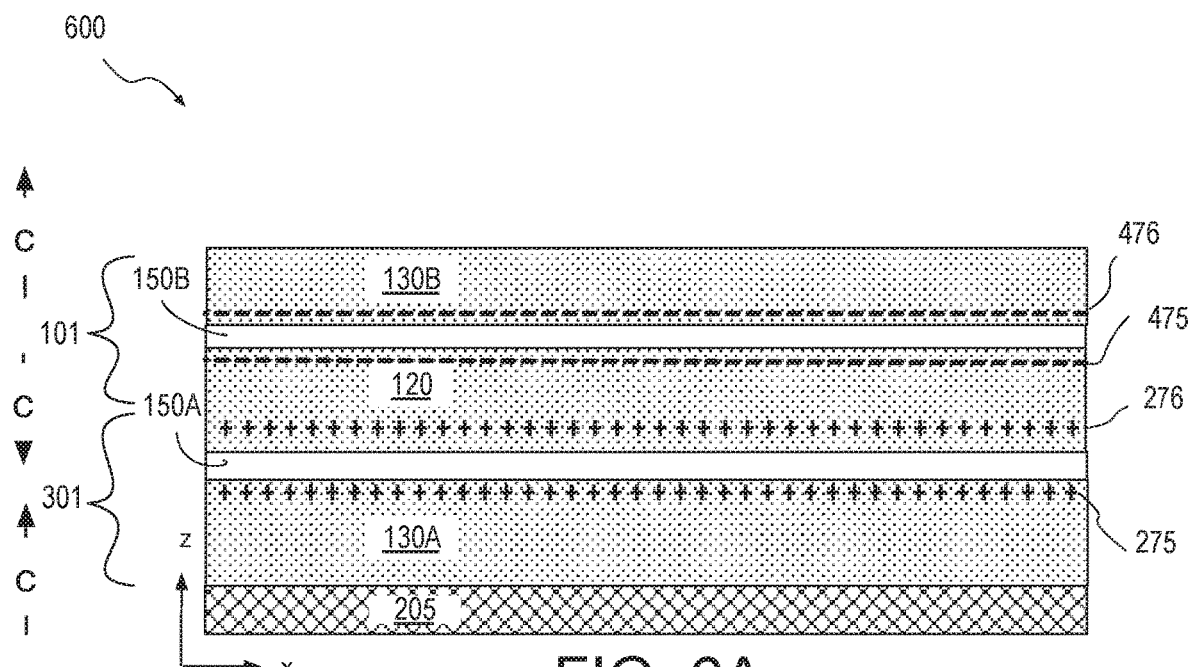
FIGS. 6A, 6B, 6C, 6D, 6E, 6F, 6G, 6H, 6I, 6J, 6K and 6L are cross-sectional views of N-type and P-type III-N transistors evolving as selected operations in the methods illustrated in FIG. 5B are performed, in accordance with some embodiments.
Figure 6B:
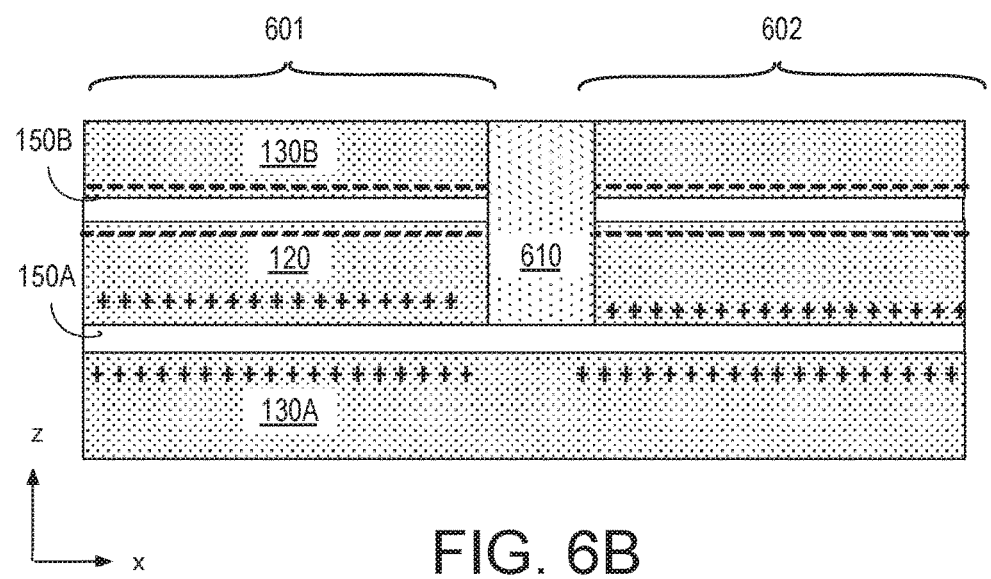
Figure 6C:
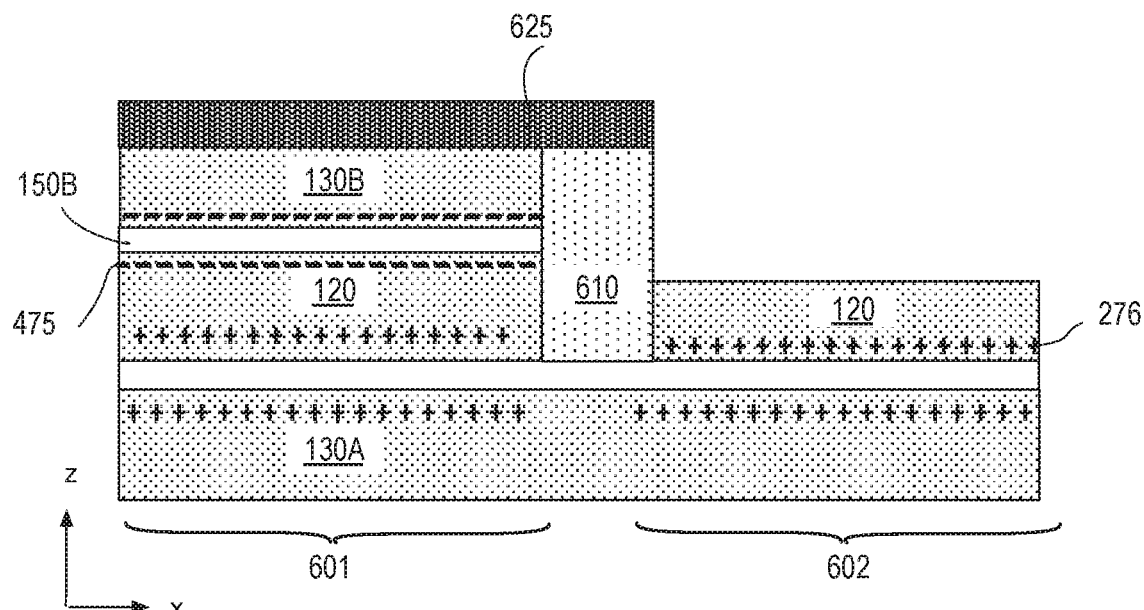

FIG. 5A is a flow diagram illustrating methods 501 of forming a substrate including the III-N polarization junctions illustrated in FIG. 1 and FIG. 3, in accordance with some embodiments. FIG. 6A is a cross-sectional view of a substrate material stack 600 that may be generated through the practice of methods 501, for example. The reference numbers introduced in the context of FIG. 1-FIG. 2 are retained in FIG. 6A for material layers that may have any of the properties as described for those layers above. As further shown in FIG. 6A, the Group N-face of III-N material layer 120 forms polarization junction 101 while the Group III-face of III-N material layer 120 forms polarization junction 301. In FIG. 6A, the suffixes "A" and "B" are added to reference numbers to emphasize how polarization junctions 101 and 301 are incorporated into a composite substrate material stack. Substrate material layers with reference numbers ending with "A" and "B" may have any of the properties described for material layers of the same root reference number. Hence, in FIG. 6A, intervening material layers 150A and 150B may both have any of the properties described above for intervening material layer 150. Likewise III-N material layers 130A and 130B may both have any of the properties described above for III-N material layer 130.

Referring back to FIG. 5A, methods 501 begin at operation 505 where a substrate including a crystalline seed layer is received. The substrate received at operation 505 may be any substrate suitable for epitaxial growth of a III-N material stack, for example. Such a substrate may include any suitable material, materials, or layers. In some embodiments, the substrate has cubic crystallinity with a predetermined crystal orientation (e.g., (100), (111), (110), or the like). For such embodiments, template structures may be formed on a cubic substrate surface, such as a (100) surface. III-N crystals may also be grown on other surfaces (e.g., 110, 111, miscut or offcut, for example 2-10° toward (110), etc.). In some such examples, the substrate includes a semiconductor material such as monocrystalline silicon (Si), germanium (Ge), silicon germanium (SiGe). Other crystalline materials, such as, but not limited to, gallium arsenide (GaAs), or silicon carbide (SiC), sapphire ($Al_2O_3$) are also suitable as a substrate seeding surface. In some examples, the substrate includes silicon having a (100) crystal orientation with a 4°-11° miscut (with 4°-6° being particularly advantageous). In other examples, the substrate includes silicon with a crystal orientation of (111), which may offer the advantage of a smaller lattice mismatch with III-N materials than (100) or (110) silicon surfaces. The substrate may include one or more buffer layers of II-N material. The substrate may also include a host substrate material upon which a III-N crystal has been bonded, in which case the host substrate may be crystalline, or not (e.g., glass, polymer, etc.). In various examples, the substrate may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, or the like.

Method 501 continues at operation 510, where a III-N epitaxial growth process is employed to form a III-N material layer having a first crystal polarity on the substrate seeding surface. Such epitaxial growth may form a continuous crystal over an entire surface of a substrate, or may be limited to crystalline islands or mesas occupying only a portion of a substrate surface as controlled through a templating pattern. Polarity of the crystal growth may be controlled through growth conditions, for example by introducing precursors under growth conditions (e.g., temperature and partial pressures) that favor nucleation having either −c or +c polarity out of the plane of the seeding substrate surface. One or more II-N material layers having the first crystal polarity may be grown at operation 510. In the example shown in FIG. 6A, III-N material layer 130A is grown with (−c) polarity out of the plane of a substrate 205. III-N material layer 130A may have any of the compositions described above. For example, III-N material layer 130A may be intrinsic binary GaN. III-N material layer 130A may be epitaxially grown over substrate 205 with any growth technique(s) known to be suitable for III-N crystals, such as, but not limited to, metal-organic chemical vapor deposition (MOCVD), vapor phase epitaxy (VPE), or molecular beam epitaxy (MBE). In some embodiments, elevated temperatures of 600° C., or more, are employed. The growth of III-N material layer 130A may include deposition of a nucleation layer (not depicted), such as AlN, and further include growth of intrinsic GaN using predetermined epitaxial growth conditions (e.g., a first growth pressure, a first growth temperature, a first V/III growth precursor ratio).

Returning to FIG. 5A, methods 501 continue at operation 515 where a first intervening layer is formed above the III-N material layer having the first crystal polarity. As noted above, the intervening layer is to decouple the crystal polarity of two adjacent III-N material layers and thereby facilitate a polarity inversion. In some embodiments, operation 515 entails an epitaxial growth of a precursor material that is suitable as a nucleation layer for III-N epitaxial growths. In the example shown in FIG. 6A, intervening layer 150A may have been epitaxially grown or deposited (e.g., by atomic layer deposition) directly on the III-N material layer 130A. Such a precursor material may also have the first crystal polarity, for example, or an alternative crystal polarity, or alternative crystallinity (e.g., trigonal or cubic), or may be amorphous in the as-deposited state. In some embodiments, operation 515 further entails an oxidation of the precursor material epitaxially grown over the III-N material layer. For example, a binary AlN layer with the first crystal polarity may be grown at operation 515 and then subsequently oxidized, for example with any in-situ or ex-situ oxidation technique known to be suitable for at least a surface of a crystalline or amorphous AlN layer. If the AlN is amorphous as-deposited, a thermal process may be performed before or after oxidation to at least partially melt the amorphous material and induce crystallization. This oxidized surface (e.g., $Al_xO_y$) may then be advantageous for inverting the polarity of III-N material during subsequent epitaxial growth processes. Similar growth and oxidation processes may also be performed to form other material compositions, such as, but not limited to, $Sc_xO_y$ or AlScO.

In some alternative embodiments, operation 515 includes the deposition of an amorphous or polycrystalline material that is suitable as a bonding layer between two III-N material layers. Any deposition process known to be suitable for any of the exemplary materials described above may be employed to form the amorphous or polycrystalline intervening layer over. For example, chemical vapor deposition (CVD), plasma-enhanced CVD (PECVD), or atomic layer deposition (ALD) may be employed at operation 515 to deposit a silicon oxide, or any of the high-k materials described above.

Methods 501 continue at operation 520 where a III-N layer having a second crystal polarity, substantially opposite to, or inverted from, the first crystal polarity is formed above the intervening layer deposited at operation 515. In the example shown in FIG. 6A, III-N material layer 120 has been formed directly on intervening layer 150A. Polarity of the crystal growth at operation 120 may be controlled through growth conditions, for example by introducing precursors under growth conditions (e.g., temperature and partial pressures) that favor nucleation having either −c or +c polarity out of the plane of the seeding substrate surface. One or more III-N material layers having the second crystal polarity may be grown at operation 520. In the example shown in FIG. 6A, III-N material layer 120 is grown with (−c) polarity out of the plane of substrate 205. In some embodiments where operation 520 entails the growth of multiple III-N material layers, both a nucleation layer and a bulk III-N layer of greater thickness are epitaxially grown. For example, a nucleation layer of a material other than binary GaN (e.g., AlN) may be epitaxially grown on the intervening layer (e.g., $Al_xO_y$). With proper growth conditions, the nucleation layer may initiate epitaxial growth with the desired (−c) polarity, and operation 520 may continue with the growth of any additional III-N material (e.g., binary GaN). The epitaxial growth of III-N material layer 120 may induce crystallinity into intervening layer 150A, for example as a result of partial melting. The epitaxial growth of III-N material layer 120 may be terminated upon reaching a desired target thickness. As shown in FIG. 6A, polarization doping (e.g., 2DHGs 275, 276) occurs upon the formation of III-N material layer 120.

In alterative embodiments, for example where an amorphous or polycrystalline intervening layer was deposited or otherwise formed at operation 515, layer transfer and/or wafer bonding processes may be practiced at operation 520. For example, one or more crystalline III-N material layers having the desired second crystal polarity may be provided on a sacrificial substrate. The sacrificial substrate may be, for example, any of the materials described above for substrate 205. In one such embodiment, a III-N material having a desired composition is grown with (+c) polarity over the sacrificial substrate. This structure is then inverted to mate a surface of this III-N material to a surface of the intervening layer, thereby providing the desired (+c) to (−c) polarity inversion. The sacrificial substrate may then be removed, if desired.

Returning to FIG. 5A, methods 501 continue at operation 525 where another intervening material layer is formed over the III-N layer having the second crystal polarity. As noted above, this second intervening layer is also to decouple the crystal polarity of two adjacent III-N material layers and thereby facilitate another polarity inversion, substantially in the same manner as the first inversion. In some embodiments, operation 525 entails an epitaxial growth of a material that is suitable as a nucleation layer for further III-N epitaxial growths. In some embodiments, operation 525 is the same as operation 515. Methods 501 then continue at operation 530 where a third III-N layer having crystal polarity inverted from the second polarity (i.e., inverted back to the first polarity) is formed above the intervening layer that was formed at operation 525.

In the example shown in FIG. 6A, any of the materials described above for an intervening layer may be epitaxially grown or deposited (e.g., by atomic layer deposition) directly on the III-N material layer 120. As deposited, this material may also have the second crystal polarity, for example. In some embodiments, operation 525 (FIG. 5A) further entails an oxidation of precursor material epitaxially grown over the III-N material layer having the second crystal polarity, the first polarity, alternative polarity, or other crystallinity (e.g., trigonal or cubic), or may be amorphous in the as-deposited state. For example, a binary AlN layer with the second crystal polarity may be grown at operation 525 as a precursor material and then subsequently oxidized, for example with any in-situ or ex-situ oxidation technique known to be suitable for oxidizing at least a surface of a crystalline or amorphous AlN layer. If the AlN is amorphous as-deposited, a thermal process may be performed before or after oxidation to at least partially melt the amorphous material and induce crystallization. This oxidized surface (e.g., $Al_xO_y$) may then be advantageous for inverting the polarity of III-N material during subsequent epitaxial growth processes. Similar growth and oxidation processes may also be performed to form other material compositions, such as, but not limited to, $Sc_xO_y$ or AlScO.

In some alternative embodiments, operation 525 includes the deposition of an amorphous or polycrystalline material that is suitable as a bonding layer between two III-N material layers. Any deposition process known to be suitable for any of the exemplary materials described above may be employed to form an amorphous or polycrystalline intervening layer over. For example, chemical vapor deposition (CVD), plasma-enhanced CVD (PECVD), or atomic layer deposition (ALD) may be employed at operation 525 to deposit a silicon oxide, or any of the high-k materials described above.

In the example shown in FIG. 6A, III-N material layer 130B is formed directly on intervening layer 150B. Polarity of the crystal growth may be controlled through growth conditions, for example by introducing precursors under growth conditions (e.g., temperature and partial pressures) that favor nucleation having either −c or +c polarity out of the plane of the seeding substrate surface. One or more III-N material layers having the first crystal polarity may be grown at operation 530. In the example shown in FIG. 6A, III-N material layer 130B is grown with (+c) polarity out of the plane of intervening layers 150A, 150B and/or substrate 205. In some embodiments where operation 530 entails the growth of multiple III-N material layers, both a nucleation layer and a bulk III-N layer of greater thickness are epitaxially grown. For example, a nucleation layer of a material other than binary GaN (e.g., AlN) may be epitaxially grown on the intervening layer (e.g., $Al_xO_y$). With proper growth conditions, the nucleation layer may initiate epitaxial growth with the desired (+c) polarity, and operation 530 may continue with the growth of any additional III-N material (e.g., binary GaN). The epitaxial growth of III-N material layer 130B may be terminated upon reaching a desired target thickness. As shown in FIG. 6A, polarization doping (e.g., 2DEGs 575, 576) occurs upon the formation of III-N material layer 220B.

In alterative embodiments, for example where an amorphous or polycrystalline intervening layer was deposited or otherwise formed at operation 525, layer transfer and/or wafer bonding processes may be practiced at operation 530. Such bonding and/or layer transfer may proceed as a second iteration of a bonding/transfer process performed at operation 515. Alternatively a stack of material layers including a polarization junction fabricated upstream by any means may be transferred and/or bonded at operation 515 or operation 530 to arrive at the same final structure. For example, one or more crystalline III-N material layers having the desired first crystal polarity may be provided on a sacrificial substrate. The sacrificial substrate may be, for example, any of the materials described above for substrate 205. In one such embodiment, a III-N material having a desired composition is grown with (−c) polarity over the sacrificial substrate. This structure is then inverted to mate a surface of this III-N material to a surface of the intervening layer, thereby fabricating in the desired (−c) to (+c) polarity inversion. The sacrificial substrate may then be removed.

Returning to FIG. 5A, methods 501 complete at operation 535 where both P-type and N-type transistors are fabricated using the material stack thus far generated. Such transistors may then be further interconnected into a CMOS circuit with one or more interconnect levels formed using any techniques known to be suitable for the purpose. For example, one or more of the circuit structures further described below may be fabricated and operation 535 and any known back-end-of-line (BEOL) processing may then complete the IC. Following operation 535, an IC including complementary III-N transistors utilizing polarization junctions is substantially complete and may be singulated and packaged following any suitable techniques.

Figure 5B:
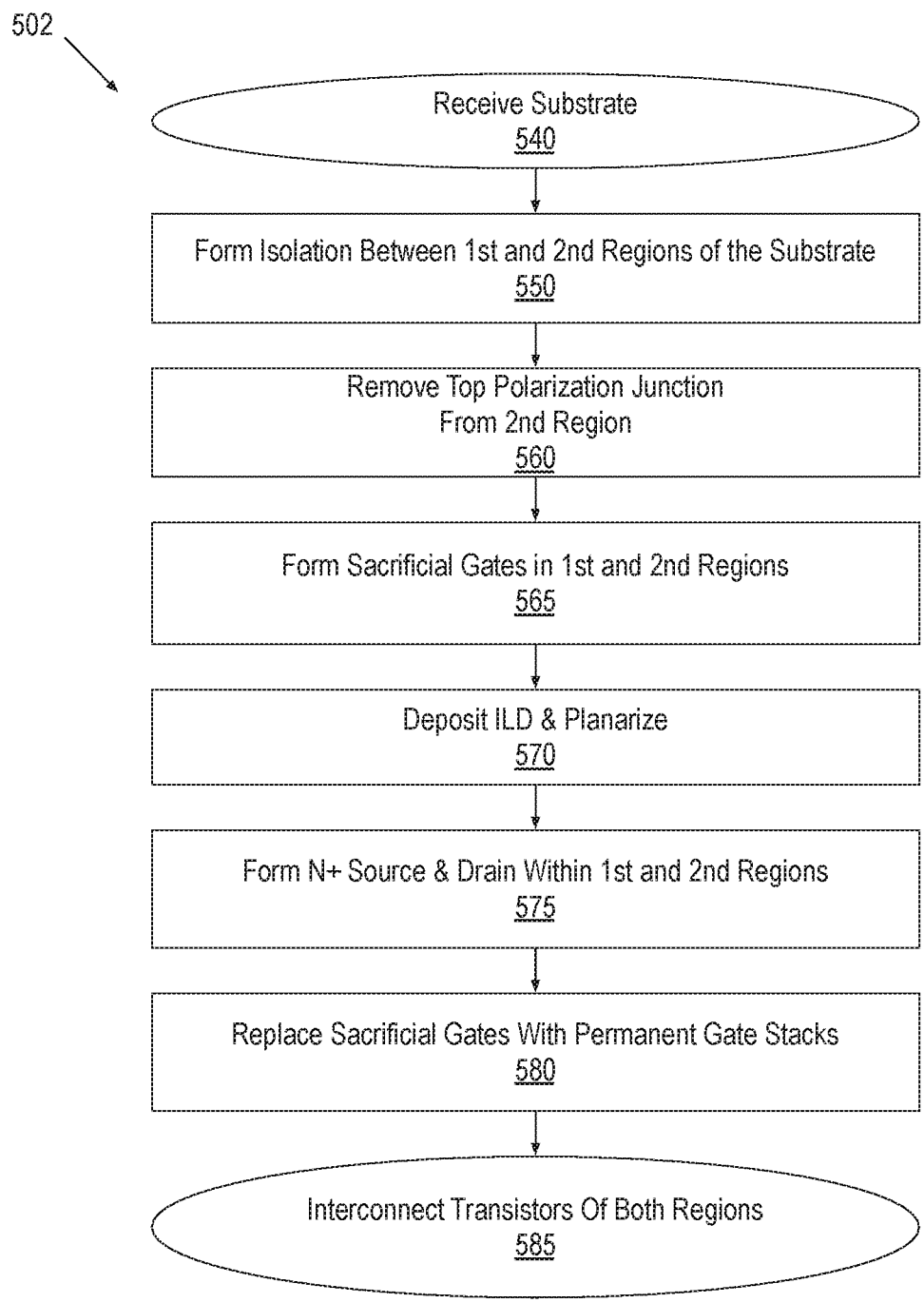
FIG. 5B is a flow diagram illustrating methods of fabricating an integrated circuit structure including N-type and P-type III-N transistors and complementary polarization junctions, in accordance with some embodiments.

FIG. 5B is a flow diagram illustrating methods 502 of fabricating an integrated circuit structure including N-type and P-type III-N transistors and complementary polarization junctions, in accordance with some embodiments. Methods 502 may be performed as part of operation 535 in methods 501, for example. FIG. 6B-6L are cross-sectional views of N-type and P-type III-N transistors evolving as selected operations in the methods 502 are performed on the substrate material stack illustrated in FIG. 6A, in accordance with some embodiments.

Referring first to FIG. 5B, methods 502 begin with receiving a substrate at operation 540. The substrate received includes a stack of material layers, including two polarization junctions between III-N material layers having crystal polarity inversions, for example as described above in the context of methods 501. In exemplary embodiments, the two polarization junctions are of complementary conductivity types, with a first of the junctions associated with a 2DHG and a second of the junctions associated with a 2DEG. Although the two polarization junctions may form a stack in which either junction is above the other, in some embodiments the substrate received is substantially as illustrated in the example shown in FIG. 6A with polarization junction 101 above polarization junction 301. Each the III-N material layers in the substrate may be of a unique III-N alloy composition. Each of the III-N material layers may also be any of those compositions described above in the context of polarization junctions 101 and 301. In some exemplary embodiments however, III-N material layer 120 has the same composition as III-N material layers 130A and 130B located on opposite faces of III-N material layer 120 so the polarization fields are all equal (e.g., P2). In some such embodiments, III-N material layer 120 and III-N material layers 130A and 130B are all binary GaN. III-N material layer 120 and III-N material layers 130A and 130B may also all be doped or undoped (i.e., not intentionally doped with donor or acceptor impurities). In some embodiments, III-N material layer 120 has a thickness greater than that of at least one of III-N material layers 130A and 130B. In some embodiments. III-N material layer 120 has a thickness greater than that of each of III-N material layers 130A and 130B (e.g., to avoiding carriers tunneling between the complementary charge sheets). In some exemplary embodiments, III-N material layer 120 is no more than 30 nm in thickness (e.g., along c-axis), while the thicknesses of III-N material layers 130A and 130B may each vary as described above for III-N material layer 120. In the illustrated embodiment, each of the depicted layers are in direct contact with the material layer above and below. However, one or more other material layers (not depicted) may be inserted between various ones of the illustrated layers.

Returning to FIG. 5B, methods 502 continue at operation 550 where one or more isolation structures are formed between a region of the substrate in which a P-type transistor is to be fabricated and a region of the substrate in which a N-type transistor is to be fabricated. The isolation structures may include one or more dielectric material that electrically isolates one or more of the polarization junctions in one of substrate regions from the polarization junction(s) in an adjacent substrate region. As further shown in FIG. 6B, for example, an opening extending through III-N material layer 130B, through intervening layer 150B, and through III-N material layer 120, and exposing intervening layer 150A is at least partially backfilled with an isolation dielectric 610. In some embodiments, isolation dielectric 610 includes both silicon and oxygen (e.g., SiO, SiON, SiOC(H), etc.). In some embodiments, the opening is completely backfilled with isolation dielectric 610, for example using any STI process where a polish planarizes a top surface of isolation dielectric 610 with III-N material layer 130B. The structure including isolation dielectric 610 demarks a boundary between substrate region 601 and substrate region 602. Substrate region 601 is where a transistor of a first conductivity type (e.g., N-type) is to be formed. Substrate region 602 is where a transistor of a complementary conductivity type (e.g., P-type) is to be formed.

Methods 502 continue at operation 560 where one of the polarization junctions is removed from the substrate material stack within one of the regions. This removal process is to expose the other polarization junction of the substrate material stack to further processing. Any masked etch process suitable for the compositions of the III-N material(s) and intervening material layer may be employed at operation 560. In the exemplary embodiment shown in FIG. 6C, a mask material 625 is patterned to define a mask that protects substrate region 601 while exposing substrate region 602. Mask material 625 may also protect isolation structure 610. Exposed portions of III-N material layer 130B are then etched with any suitable wet or dry etch process, further exposing intervening layer 150B. Intervening layer 150B is then etched within substrate region 602 to reveal III-N material layer 120, where the etch is stopped to retain at least the portion of III-N material layer 120 where 2DHG 276 resides.

Returning to FIG. 5B, methods 502 continue at operation 565 where sacrificial gate mandrels are fabricated according to any suitable techniques. At operation 570 interlayer dielectric (ILD) is deposited and planarized with the sacrificial gate mandrels. The ordering of operations in methods 502 may vary, and as one example, operation 570 may alternatively precede operation 565. As further shown in FIG. 6D, a sacrificial gate mandrel 621 having a first height H1 is formed within region 601 while a sacrificial gate mandrel 622 having a second height H2 is concurrently formed within region 602. The difference in heights H1 and H2 accommodates the substrate recess within region 602, which is may be only 10-15 nm, for example. In some exemplary embodiments, sacrificial gate mandrels 621 and 622 comprise the same material layer(s), such as, but not limited to, semiconductors (e.g., polysilicon), dielectrics (e.g., SiO, SiN, SiON), and metals (e.g., W, TiN). As further shown in FIG. 6E, an ILD 630 is deposited over the substrate within both regions 601 and 602, covering isolation dielectric 610, covering III-N material layer 130B, and covering III-N material layer 120. ILD 630 may be any dielectric material of conventional relatively permittivity (e.g., SiO, SiN, SiON), or a low-k dielectric (e.g., SiOC(H), MSQ, HSQ). In some embodiments, ILD 630 includes both silicon and oxygen. ILD 630 may be deposited with any process known to be suitable for the selected material, such as, but not limited to, chemical vapor deposition (CVD), plasma enhanced CVD (PECVD), atomic layer deposition (ALD), or spin-on depositions. ILD 630, as-deposited or following a chemical-mechanical polish (CMP), has a top surface that is substantially (i.e., +/−a few nanometers) planar with a top surface of gate mandrels 621, 622.

Returning to FIG. 5B, methods 502 continue at operation 575 where transistor source and drain structures are fabricated. In some embodiments, source and drain structures for both N-type and P-type transistors are formed concurrently at operation 575. Source and drain structures may include III-N material, and may advantageously include one or more impurity dopants imparting a desired conductivity type (e.g., N-type and/or P-type). The III-N material of a source and drain may be single crystalline or polycrystalline. For some embodiments, a III-N material including donor impurities is deposited, or epitaxially grown, for source and drain structures in a first region of the substrate where N-type transistors are to be formed while a III-N material including acceptor impurities is deposited, or epitaxially grown, for source and drain structures in a second region of the substrate where P-type transistors are to be formed. For some alternative embodiments, a III-N material including donor impurities is deposited, or epitaxially grown, for source and drain structures within both N-type transistor and P-type transistor regions of a substrate. During operation of a P-type transistor, N+ source and drain material allows device current to be conducted through electrons up to the point where the charge carriers quantum mechanically tunnel into the 2DHG. This donor-doped material is therefore coupled to the 2DEG in one region of the substrate, and to the 2DHG in another region of the substrate.

One or more masking and substrate etch process may be employed to define the source and drain structures. In the example shown in FIG. 6F, a mask 635 is deposited over ILD 630 and gate mandrels 621, 622, and then patterned to define source and drain mask openings. Mask 635 protects gate mandrels 621, 622 and a portion of ILD 630 that is adjacent to a sidewall of gate mandrels 621, 622. Portions of the substrate material layers unprotected by mask 635 are recessed etched, for example to form source and drain openings 640 and 641 extending through ILD. Within substrate region 601, source and drain openings 640 further extend through a portion of III-N layer 130B, for example landing within III-N layer 130B at some predetermined depth near where 2DEG 476 resides (e.g., 2-4 nm of intervening layer 150B). Within substrate region 602, source and drain openings 641 further extend through a portion of III-N layer 120, for example landing within III-N layer 120 at some predetermined depth near where near 2DHG 276 resides. The source and drain opening etch may comprise a first etch process selective to ILD 630, which may stop on III-N material layer 130B and III-N material layer 120 within regions 601 and 602, respectively. A second etch process may then remove a portion of III-N layer 130B within region 601 and remove a portion of III-N layer 120. Where III-N layer 120 has a comparable thickness as III-N layer 130B, this second etch process may be performed within regions 601 and 602 concurrently. Source and drain openings 640, 641 may also extend deeper into the substrate material stack. For example, source and drain openings 640 may extend completely through III-N layer 130, intervening layer 150B, and even through III-N layer 120. Source and drain openings 641 may likewise extend completely through III-N layer 120 and intervening layer 150A. For such embodiments, 2DEG 476 and 2DHG 276 may be exposed at the sidewall of III-N layers 130B and 120, respectively.

Figure 6D:
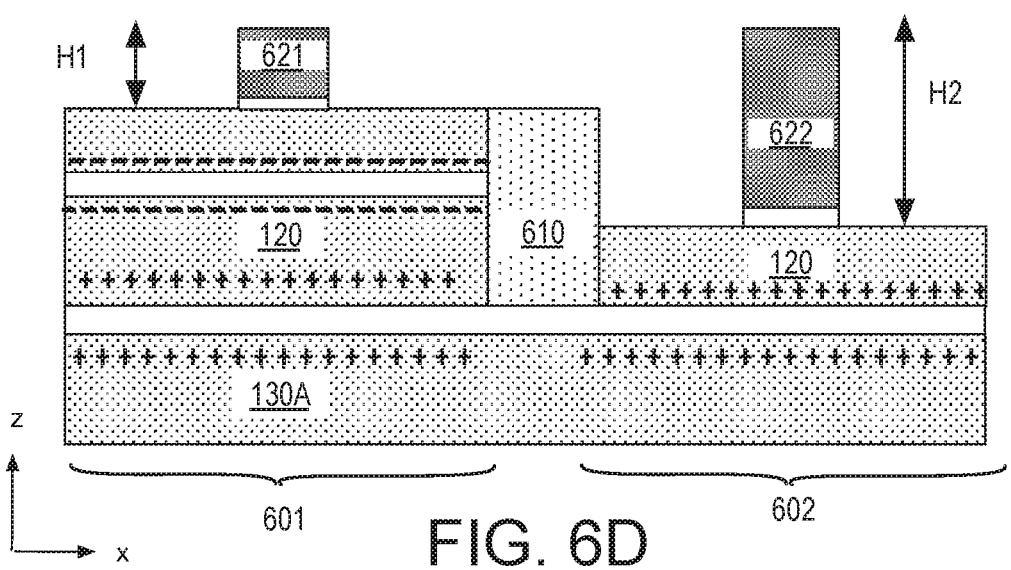
Figure 6E:
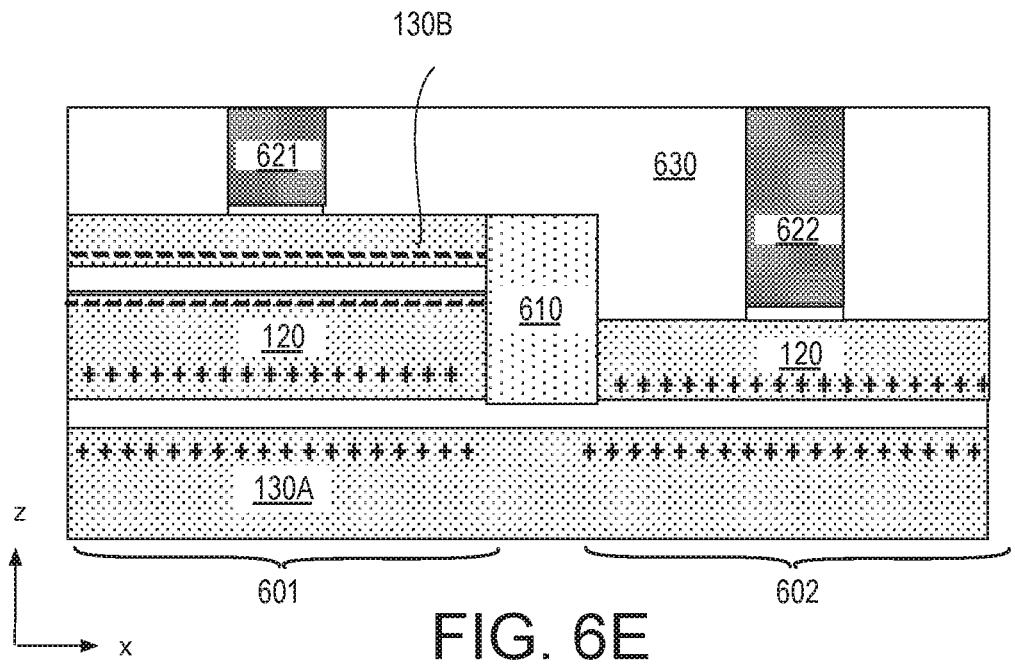
Figure 6F:
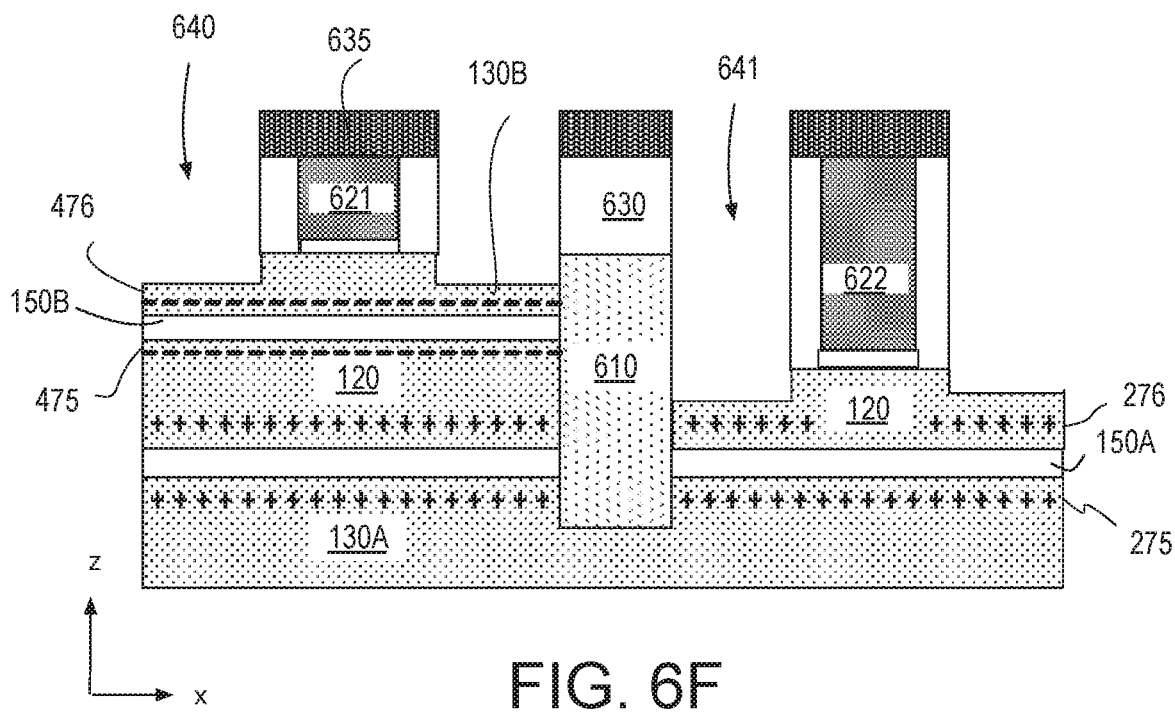
Figure 6G:
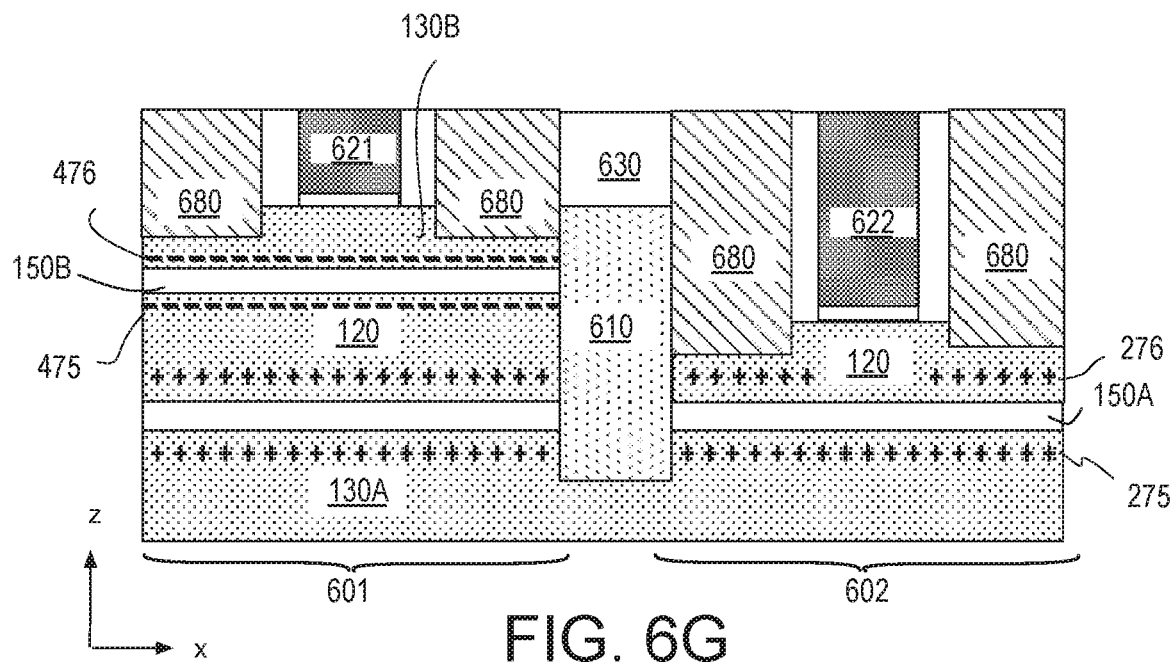

As further shown in FIG. 6G, source and drain openings 640 and 641 are at least partially filled with source and drain material 680. In the illustrated embodiments, source and drain material 680 intersects an area of III-N material layer 230B and III-N material layer 120 near where the charge sheets reside. The source and drain junctions to 2DEG 476 and 2DHG 276 therefore scale with the footprint of source and drain material 680. In alternative embodiments where the source and drain openings expose 2DEG 476 and 2DHG 276 at a sidewall of III-N layers 130B and 120, source and drain material 680 forms a junction at the sidewall. For such embodiments, much of the transistor current between source and drain material 680 and III-N material layers 130B and 120 will occur at this sidewall interface.

In the embodiment shown in FIG. 6G, source and drain material 680 is a crystalline III-N material that has a first orientation (e.g., +c polarity matching III-N material layer 130B) within substrate region 601, and has the opposite orientation (e.g., −c polarity matching III-N material layer 120) within substrate region 602. Such crystal polarities may be naturally achieved during a single epitaxial growth based on the crystallinity of the seeding surfaces. Source and drain material 680 may form a homojunction with one or both of III-N material layers 120 and 130B. Source and drain material 680 may also form a heterojunction with one or both of III-N material layers 120 and 130B. Hence, source and drain material 680 may have the same majority lattice constituents as III-N material layers 120 and 130B, or include other majority lattice constituents. Where both III-N material layers 120 and 130B are binary GaN, lower source and drain resistance may be achieved where source and drain material 680 forms a heterojunction (e.g., abrupt or graded) with III-N material layers 120 and 130B. In some exemplary embodiments, source and drain material 680 has a narrower band gap than that of III-N material layers 120 and 130B. For example, source and drain material 680 may be a III-N alloy that includes more Indium (In) than III-N material layers 120 and 130B. In some embodiments, source and drain material 680 is $In_xGa_{1-x}N$, (e.g., where x is between 0.05 and 0.2).

Source and drain material 680 may advantageously include one or more impurity dopants imparting a conductivity type matching that of one of the underlying polarization junctions (e.g., N-type). In some exemplary embodiments, source and drain material 680 includes a donor impurity dopant such as Si or Ge. In some such embodiments, the donor impurity concentration with source and drain material 680 is at least $1e18/cm^3$, and advantageously $1e19/cm^3$, or more. In alternative embodiments where the source and drain semiconductor materials have different conductivity types between substrate region 601 and substrate region 602, source and drain material 680 within a P-type transistor region includes acceptor impurity dopants, such as, but not limited to, Mg. While III-N materials can be challenging to dope p-type, Mg dopant levels of at least $1e17-1e18$ atoms/$cm^3$ are achievable in binary GaN, for example. Mg dopant levels of $1e19$ atoms/$cm^3$, or more may also be possible.

Returning to FIG. 5B, methods 501 continue at operation 580 where the sacrificial gate mandrels are replaced with permanent gate stacks. Any "gate-last" type gate replacement process(es) may be performed at operation 580 to remove the gate mandrels formed at operation 565 and fabricate permanent gate stacks. The permanent gate stacks fabricated at operation 580 may include a gate electrode having any composition (e.g., metal or semiconductor) that provides a suitable work function. The permanent gate stacks fabricated at operation 580 may also include a gate dielectric of any material composition associated with a moderate relative permittivity (e.g., 3.5-8), or may be any material composition associated with a high relative permittivity (e.g., 10 or more). In some embodiments, a mid-gap material is employed for the gate electrode and this material is utilized for the gate electrode of both N-type and P-type transistors. In alternative embodiments, a first gate electrode material is employed for N-type transistors and a second gate electrode material is employed for P-type transistors. For such dual-gate material embodiments, operations 580 may entail an incremental replacement of subsets of the gate mandrels with permanent gate material suitable for first transistors (e.g., N-type) followed by replacing other gate mandrels with permanent gate material suitable for second transistors (e.g., P-type).

Figure 6H:
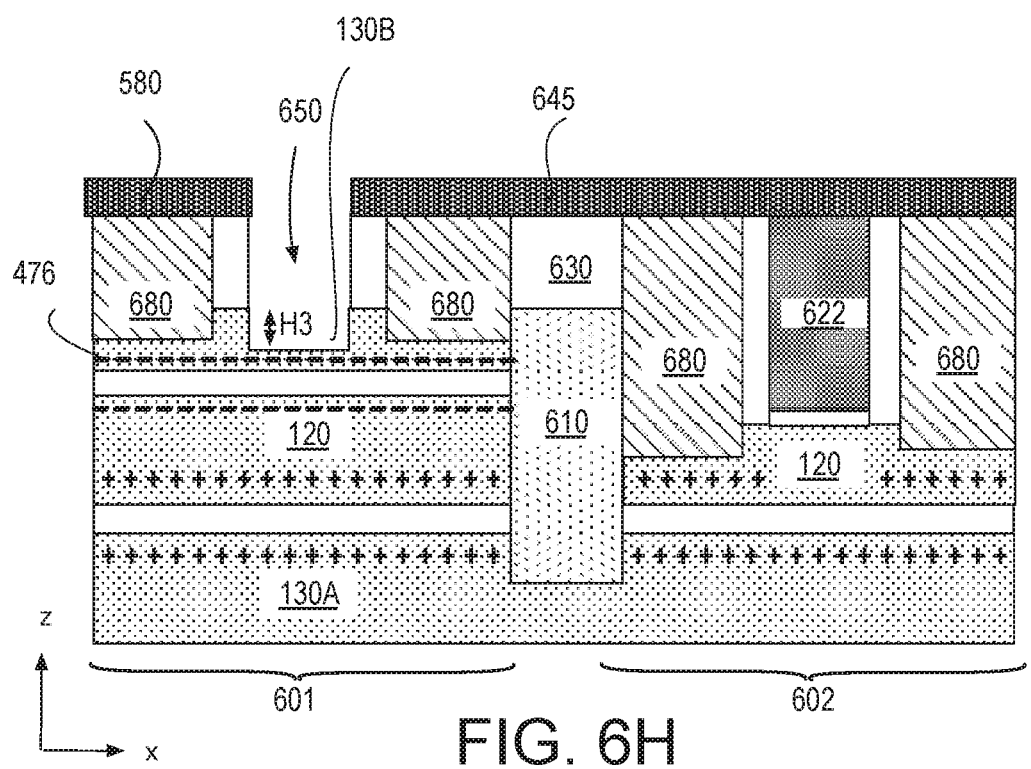

In the example shown in FIG. 6H, a mask 645 is deposited over source and drain material 680 and ILD 630. Mask 645 also protects gate mandrel 622 allowing gate mandrel 621 to be replaced selectively. A surface of III-N material layer 130B is exposed within gate opening 650 and a portion of III-N material layer 130B may then be recessed within opening 650, for example to tune the threshold voltage ($V_t$) of the N-type transistor. In some embodiments, III-N material 130B is etched to a depth H3 relative to 2DEG 476 that is suitable for an enhancement mode n-type transistor.

Figure 6I:
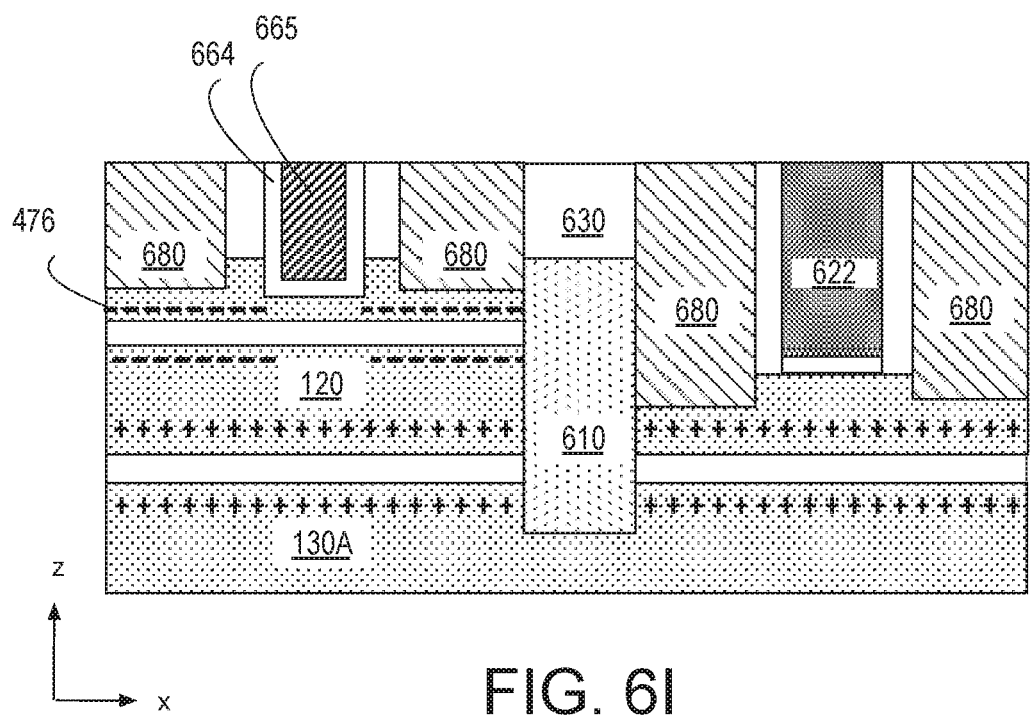

As further shown in FIG. 6I a gate stack including a gate dielectric layer 664 and a gate electrode 665 is then deposited within gate opening 650. One or more planarization process may then remove overburden and planarize a top surface of gate electrode 665 with a top surface of source and drain material 680 and/or with a top surface of ILD 630. Gate dielectric layer 664 may be silicon-based (e.g., SiO, SiON, SiN) or gate dielectric layer 664 may be a metal oxide, for example including one or more layer of aluminum oxide, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate. Gate dielectric 664 may be deposited with any process known to be suitable for the material and purpose, such as, but not limited to CVD, PECVD, and ALD. Gate electrode 665 may include a work function material as well as a cap metal. The work function material may be any n-type material including n-type semiconductor materials and n-type metals. In some examples, gate electrode 665 includes at least one of Pt, Ti, Ni, Au, Al, Ta or W. Gate electrode 665 may be deposited with any process known to be suitable for the material and purpose, such as, but not limited to CVD, ALD, and physical vapor deposition (PVD). Following formation of the gate electrode within substrate region 601, at least 2DEG 476 is depleted within a channel region of N-type transistors (i.e., at a zero volt gate bias). As further shown in FIG. 6I, 2DEG 475 may also be depleted within a channel region of N-type transistors.

Figure 6J:
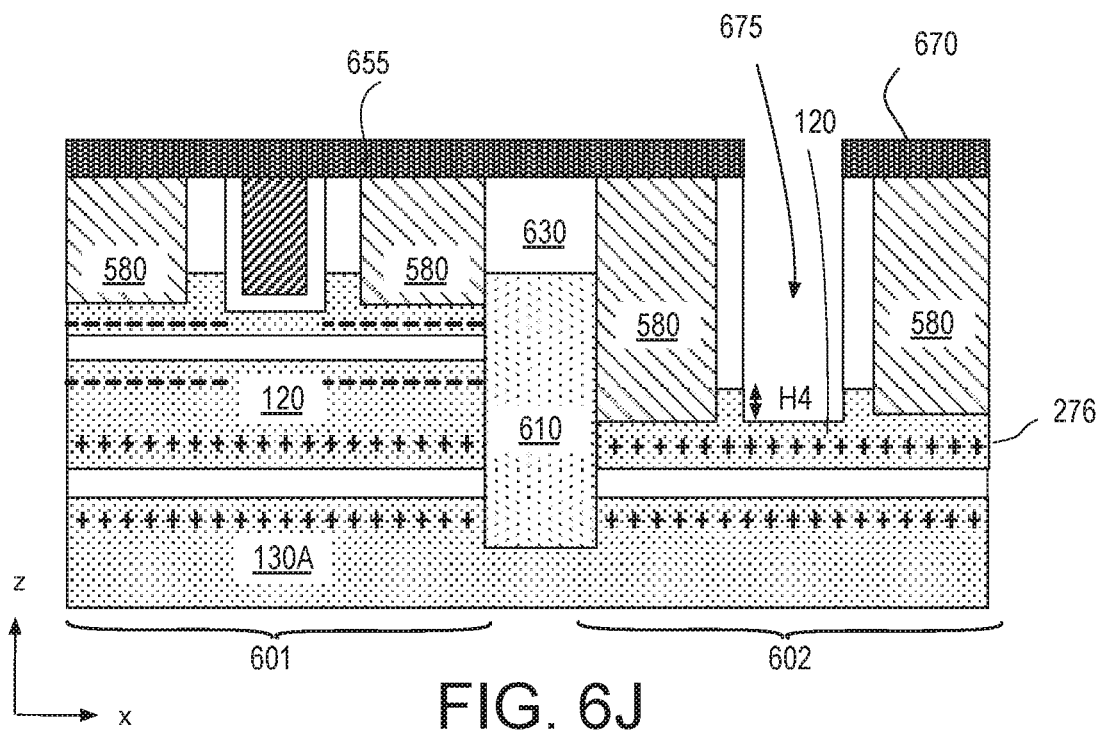
Figure 6K:
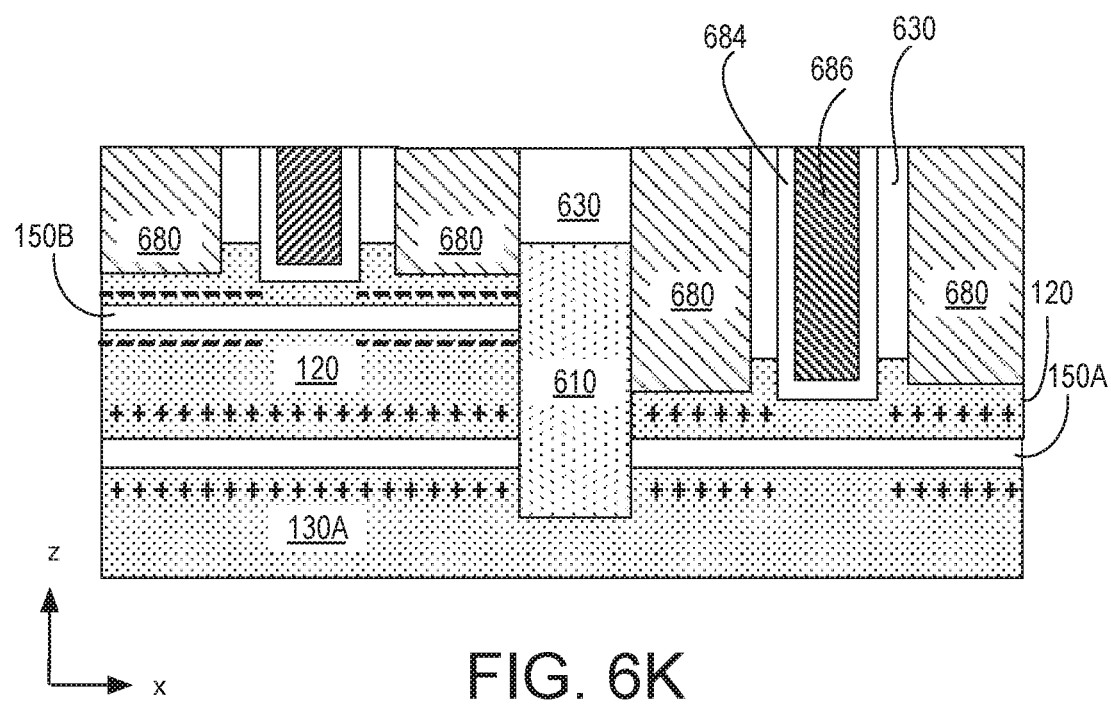
Figure 6L:
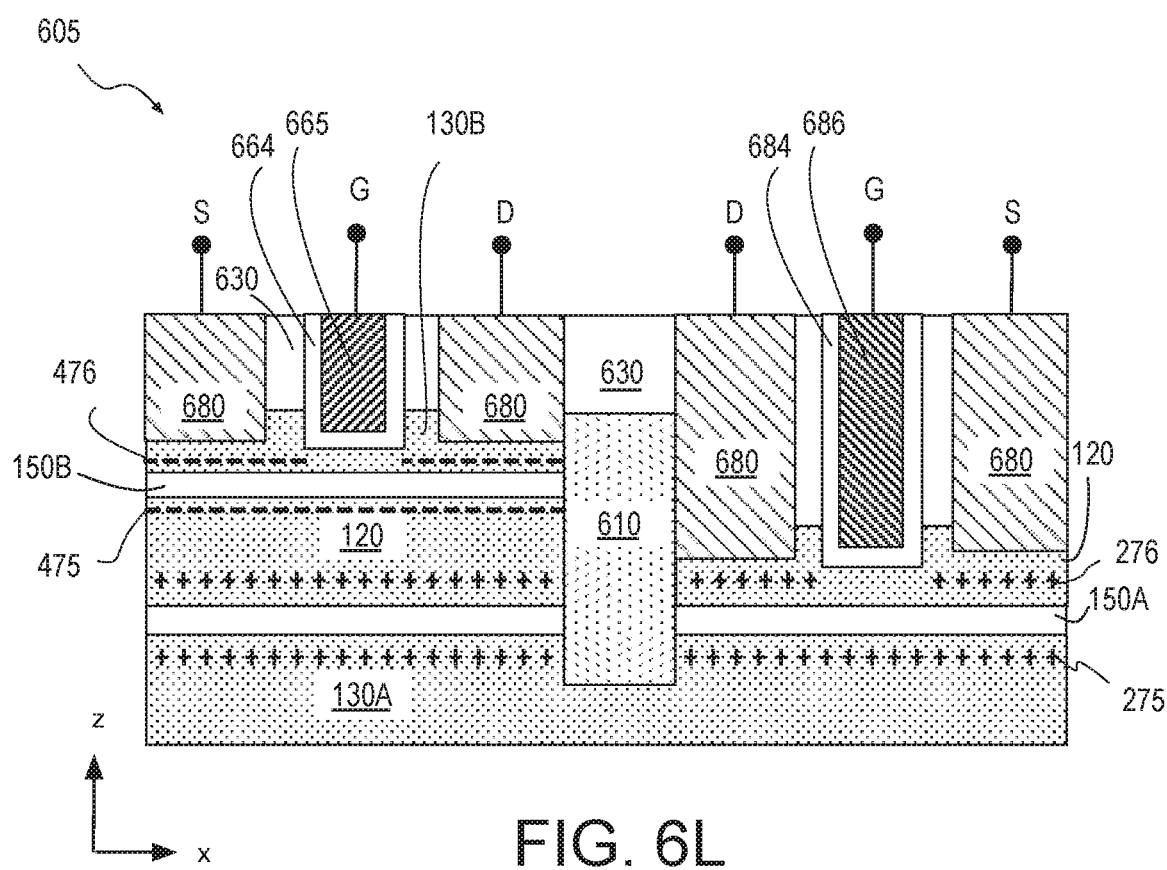

As illustrated in FIG. 6J, gate mandrel 622 a mask 655 is deposited over source and drain material 680 and ILD 630. Mask 655 also protects the gate stack within substrate region 601, allowing gate mandrel 622 to be replaced selectively. A surface of III-N material layer 120 is exposed within gate opening 675 and a portion of III-N material layer 120 may then be recessed within opening 675, for example to tune the threshold voltage ($V_t$) of the P-type transistor. In some embodiments, III-N material 120 is etched to a depth H4 relative to 2DHG 276 that is suitable for an enhancement mode p-type transistor. FIG. 6K further illustrates formation of the second permanent gate stack including gate dielectric 664 and gate electrode 686. Gate dielectric 664 may be any of the materials described above. Gate electrode 686 a work function metal as well as a cap metal. The work function material may be any p-type material including p-type semiconductor materials and p-type metals. In some examples, gate electrode 686 includes at least one of Pt, Ti, Ni, Au, Al, Ta or W. Following formation of the gate electrode within substrate region 602, at least 2DHG 276 is depleted within a channel region of P-type transistors. As further shown in FIG. 6I, 2DHG 275 may also be depleted within a channel region of P-type transistors.

With the three terminals of both the P-type and N-type transistors fabricated, methods 502 (FIG. 5B) complete at operation 585 where the transistors are interconnected into an IC. One or more levels of ILD and interconnect metallization may be fabricated at operation 585. For embodiments where the P-type and N-type are to be monolithically integrated into a CMOS III-N IC, any known back-end-of-line (BEOL) processing may be performed at operation 585 to complete the IC. Following operation 585, an IC including III-N polarization junction CMOS transistors is substantially complete and may be singulated and packaged following any suitable techniques. In the example shown in FIG. 6L, IC structure 605 is substantially complete with backend interconnect metallization levels coupling the gate electrode (G), source (S) and drain (D) terminals of N-type transistors within substrate region 601 with gate electrode, source, and drain terminals of P-type transistors in substrate region 602 into a functional IC suitable for implementing CMOS logic.

Figure 7:
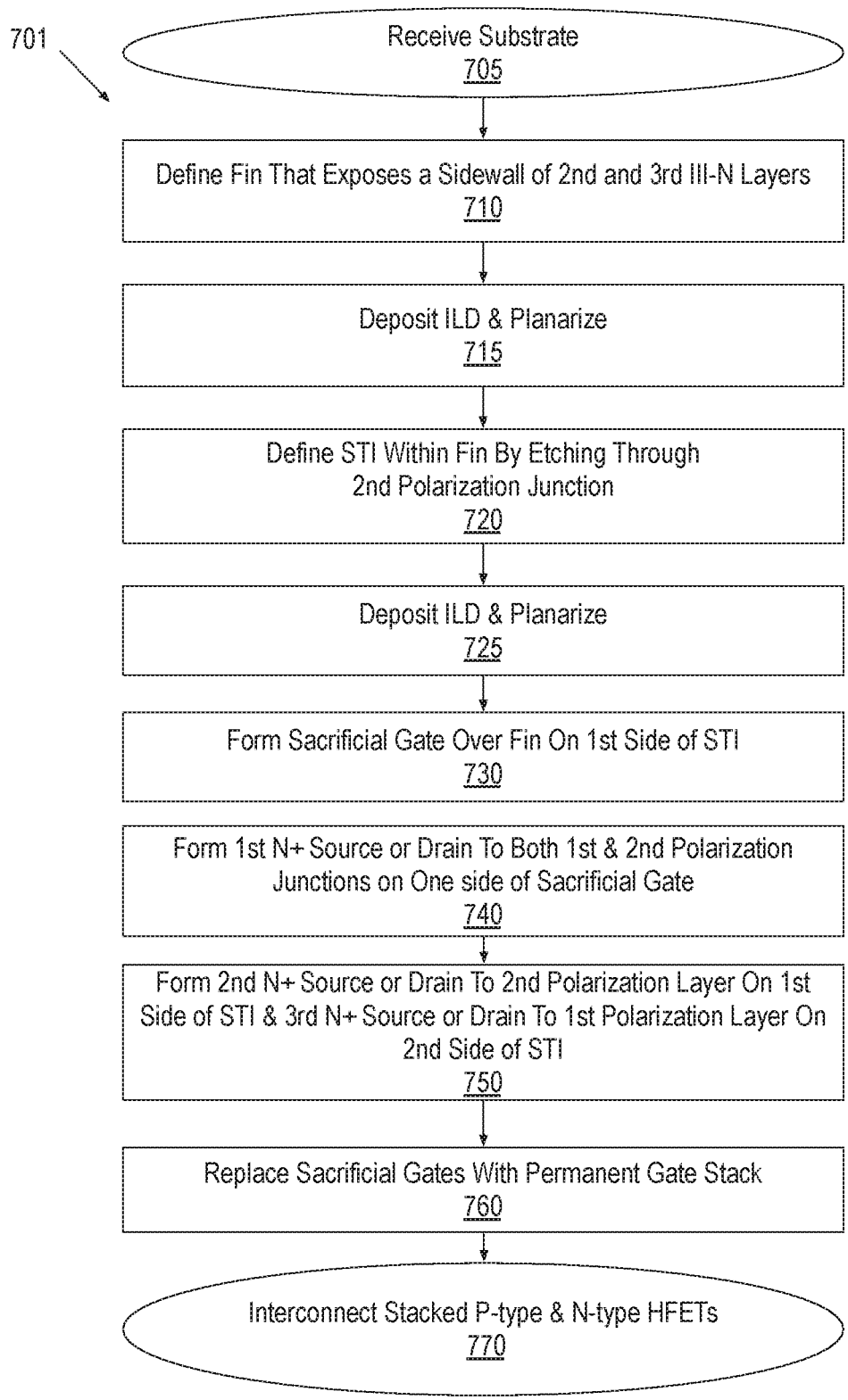
FIG. 7 is a flow diagram illustrating methods of fabricating an integrated circuit structure including stacked N-type and P-type III-N transistors and complementary polarization junctions, in accordance with some embodiments.
Figure 8A:
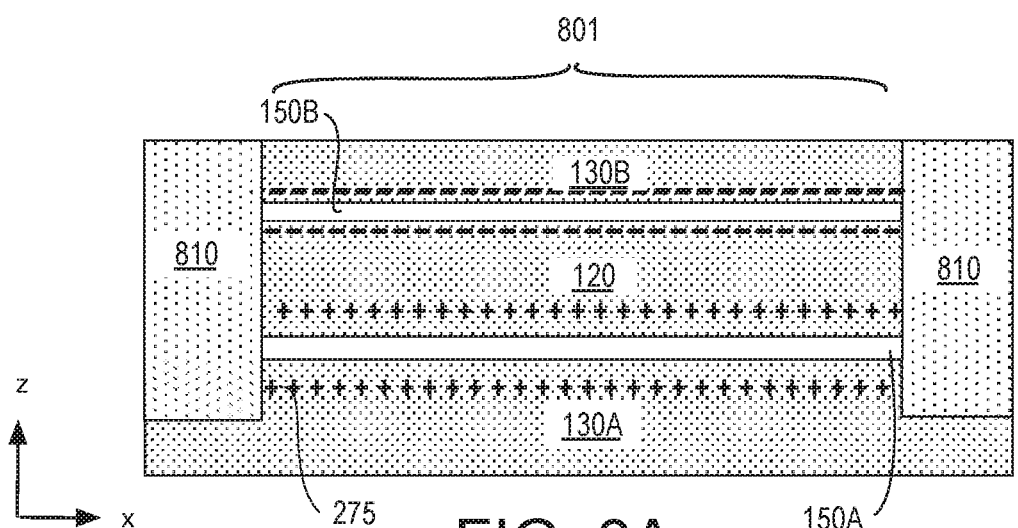
FIGS. 8A, 8B, 8C, 8D, 8E, 8F, 8G, 8H, and 8I are cross-sectional views of an integrated circuit structure including stacked N-type and P-type III-N transistors evolving as selected operations in the methods illustrated in FIG. 7 are performed, in accordance with some embodiments.
Figure 8B:
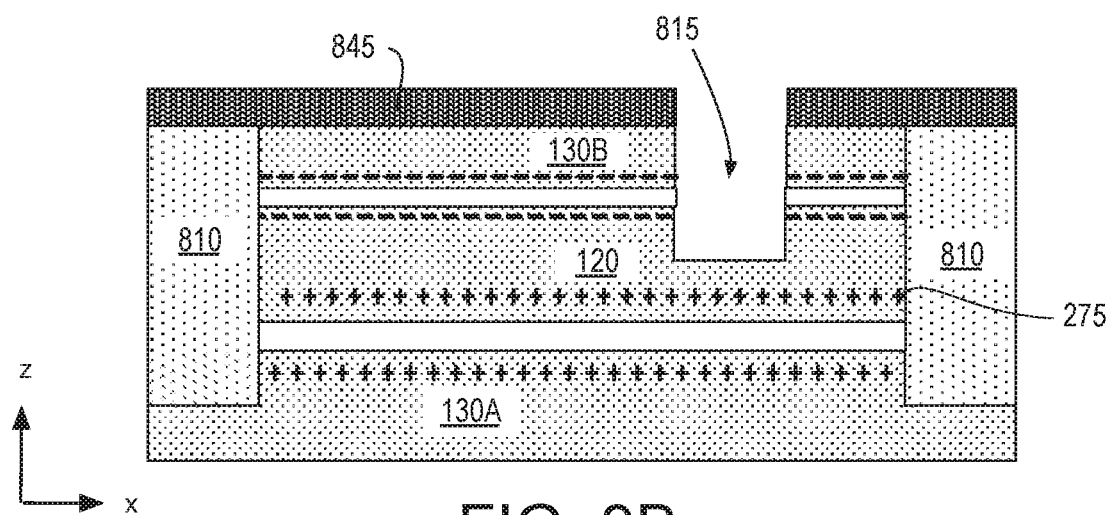
Figure 8C:
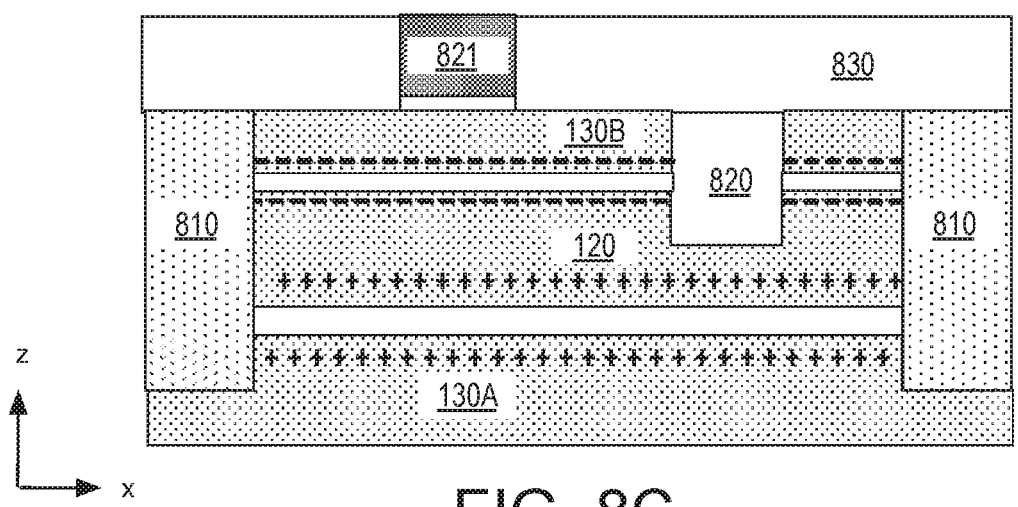

As described above, complementary III-N polarization junctions may be employed to fabricate P-type transistors and N-type transistors in two different, laterally adjacent, regions of a substrate. Because the complementary III-N polarization junctions are stacked one atop the other, P-type and N-type transistors may also be vertically stacked within a single substrate region or footprint. Such an architecture may advantageously reduce the footprint of CMOS circuitry implemented with III-N polarization junctions relative to the embodiments described above. FIG. 7 is a flow diagram illustrating methods 701 of fabricating an integrated circuit structure including stacked N-type and P-type III-N transistors and complementary polarization junctions, in accordance with some embodiments. FIG. 8A-8I are cross-sectional views of an integrated circuit structure including stacked N-type and P-type III-N transistors evolving as selected operations in the methods 701 are performed, in accordance with some embodiments. FIG. 9 is a circuit schematic for an integrated circuit structure including stacked N-type and P-type III-N transistors, in accordance with some embodiments. The integrated circuit structure illustrated in FIG. 9 may be fabricated by practicing methods 701, for example according to the examples further shown in FIG. 8A-8I.

Referring first to FIG. 7, methods 701 begin at operation 705 with receipt of a substrate including two polarization junctions, one stacked upon the other. In some exemplary embodiments the substrate received at operation 705 is the same as that received at operation 540 (FIG. 5B), and may for example be as described above for substrate material structure 600 (FIG. 6A). Methods 701 continue at operation 710 where substrate material layers are patterned, for example to form a fin that exposes a 2DEG associated within one polarization junction and a 2DHG associated with another polarization junction. An isolation dielectric is then formed around the fin, electrically isolating one fin from adjacent neighboring fins. In methods 701, the isolation dielectric is formed by depositing an ILD layer over the fin and planarizing a top surface of the IDL with a top surface of the fin. In the example shown in FIG. 8A, isolation dielectric 810 occupies an opening, trench, or gap that extends through III-N material layer 130B, through intervening layer 150B, through III-N material layer 120, through intervening layer 150A, and into III-N material layer 130A to depth below that of 2DHG. Isolation dielectric 810 completely surrounds a single fin 801 that includes two polarization junctions. Isolation dielectric 810 may be any of the materials described above for isolation dielectric 610, for example, and may be fabricated in substantially the same manner. Fin 801 may have any longitudinal length (e.g., x-dimension) and may have a transverse width (e.g., y-dimension) that may be in the range of 10-30 nm, for example.

Referring back to FIG. 7, methods 701 continue at operation 720 where a shallow trench is patterned into the fin to electrically isolate one end of the fin from the top polarization layer. At operation 725 the shallow trench is at least partially filled with a dielectric material according to any suitable STI process. In the example shown in FIG. 8B, a mask layer 845 deposited over fin 801 and isolation dielectric 810 is patterned with an opening 815. Within opening 815, III-N material layer 130B is etched through. Intervening layer 150B is also removed within opening 815. III-N material layer 120 may also be etched within opening 815, but 2DGH 275 is advantageously maintained over the entire footprint of fin 801. The shallow trench or gap formed within fin 801 is then at least partially backfilled with a shallow isolation dielectric 820, as illustrated in FIG. 8C. Shallow isolation dielectric 820 may be of the same composition as isolation dielectric 810, for example. Alternatively, shallow isolation dielectric 820 may have a different composition than isolation dielectric 810, such as, but not limited to, any of the materials described above for isolation dielectric 610. Mask 845 may be removed and any suitable technique (e.g., CMP) may be employed to planarize a top surface of shallow isolation dielectric 820 with a top surface of isolation dielectric 810 and/or with a top surface of fin 801.

Returning to FIG. 7, methods 701 continue at operation 730 where a sacrificial gate mandrel is formed over the fin and adjacent to at least a sidewall of the fin. Operation 730 may entail a patterned or unpatterned recess etch of isolation dielectric that is adjacent the fin sidewall where the gate mandrel is to overlay. The gate mandrel is fabricated on one side of the STI structure, for example using any of the techniques described above in the context of methods 502 (FIG. 5B) and/or gate mandrels 621, 622 (FIG. 6D). In the example further illustrated in FIG. 8C, an ILD 830 is deposited over the planarized fin and STI structure. ILD 830 may be any dielectric material, for example. A trench (not depicted in FIG. 8C) intersecting fin 801 may then be patterned into ILD 830 and into an underlying portion of isolation dielectric 810 to expose a sidewall of fin 801, the sidewall including at least III-N material layer 120. Sacrificial gate mandrel 821 is then deposited into the trench to be adjacent a sidewall of fin 801, and over a top surface of fin 801, as shown in FIG. 8C. In such exemplary embodiments, sacrificial gate mandrel 821 extends over a sidewall adjacent to both of the polarization junctions located within the fin.

Returning to FIG. 7, methods 701 continue at operation 740 where a first source or drain coupling to charge carrier sheets of both polarization junctions is formed on one side of the gate mandrel. The source or drain formed at operation 740 electrically couples together two transistors that are formed on a single fin. Two additional source or drains are formed at operation 750, with one of these additional drains to couple to a charge sheet associated with one of each of the polarization junctions located within the fin. Hence, the stacked transistors formed within a single fin are to share one of the source or drains formed at operation 740. One or more mask and etch process may be performed at operation 740 to form openings that land within a III-N layer proximal to one or more of the charge sheets to which the source or drain is to couple. For the example shown in FIG. 8D, a mask 846 is deposited over sacrificial gate mandrel 821 and over ILD 830. Mask 846 is then patterned one or more times to define openings where the underlying substrate layers are to be recess etched.

Figure 8D:
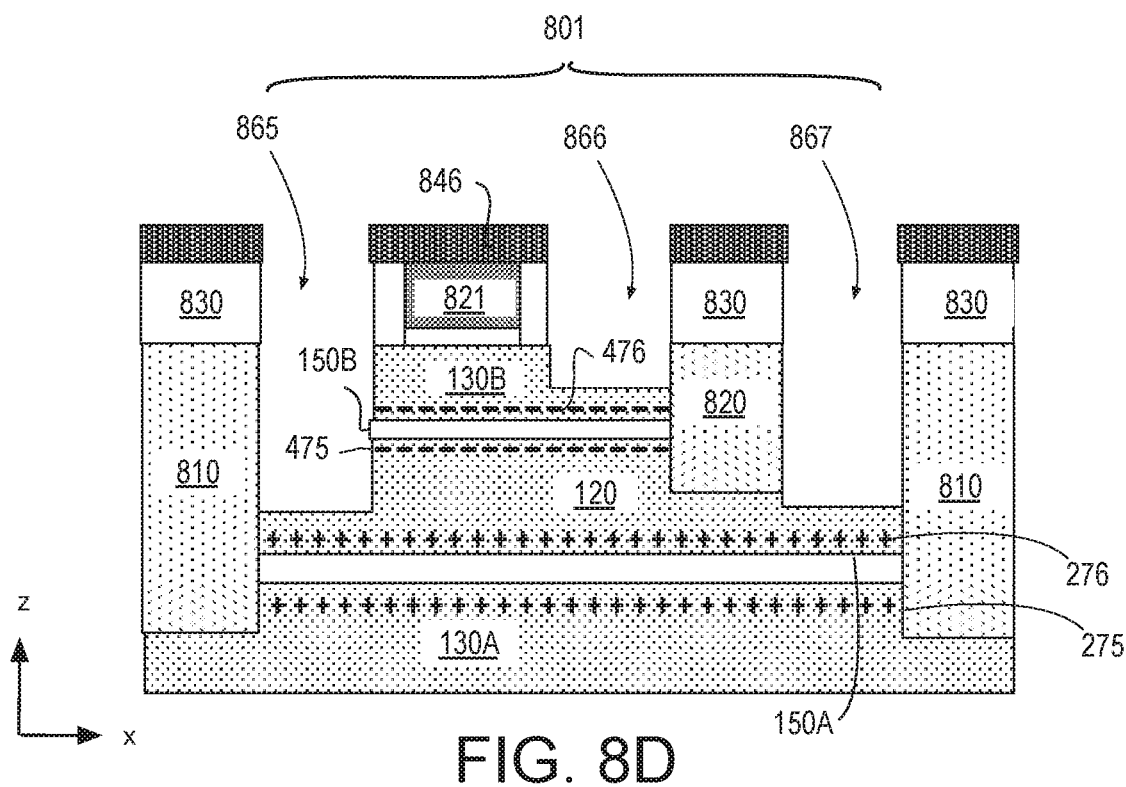
Figure 9:
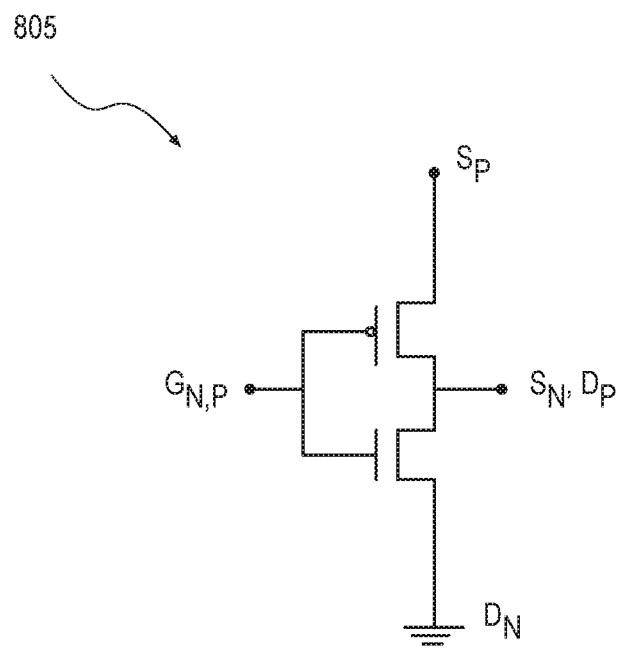
FIG. 9 is a circuit schematic for an integrated circuit structure including stacked N-type and P-type III-N transistors, in accordance with some embodiments.

As shown in FIG. 8D, three source or drain openings 865, 866 and 867 are etched into fin 801. Source or drain opening 865 extends completely through III-N material layer 130B, through intervening layer 150B and through a portion of III-N material layer 120 to land proximal to 2DHG 276 located within III-N material layer 120 near the interface of intervening layer 150A. As such, source or drain opening 865 exposes 2DEG 475 and 476 along a portion of the opening sidewall and exposes an area of 2DHG 276 approximately equal to a footprint of source or drain opening 865. Source or drain opening 866 is on the same side of STI dielectric 830 as source or drain opening 865 and extends only partially through III-N material layer 130B to land proximal to 2DEG 476 located within III-N material layer 130B near the interface of intervening layer 150B. As such, source or drain opening 866 exposes an area of 2DEG 476 approximately equal to a footprint of source or drain opening 866. Source or drain opening 867 is on the side of STI dielectric 820 opposite source or drain openings 865 and 866. Source or drain opening 867 extends completely through III-N material layer 130B, through intervening layer 150B, and partially through III-N material layer 120 to land proximal to 2DHG 276 located within III-N material layer 120 near the interface of intervening layer 150A. As such, source or drain opening 867 exposes an area of 2DHG 276 approximately equal to a footprint of source or drain opening 867.

Openings 865, 866 and 867 may all extend further into fin 801 than is illustrated in FIG. 8D, for example to expose portions of the polarization junctions along sidewalls of each opening. In some such embodiments, opening 865 can extend entirely through III-N material layer 120 and/or through intervening layer 150A. 2DHG 276 and/or 2DHG 275 would then be exposed along a sidewall of opening 865. Likewise, opening 866 can extend entirely through III-N material layer 130B and/or through intervening layer 150B. 2DEG 476 and/or 2DEG 475 would then be exposed along a sidewall of opening 866. Opening 867 can extend entirely through III-N material layer 120 and/or through intervening layer 150A. 2DHG 276 and/or 2DHG 275 would then be exposed along a sidewall of opening 867.

Figure 8E:
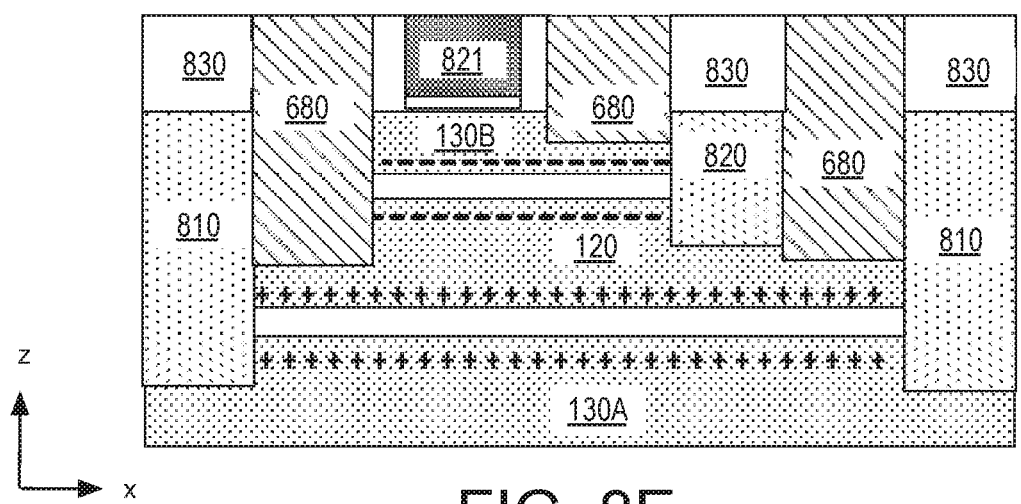
Figure 8F:
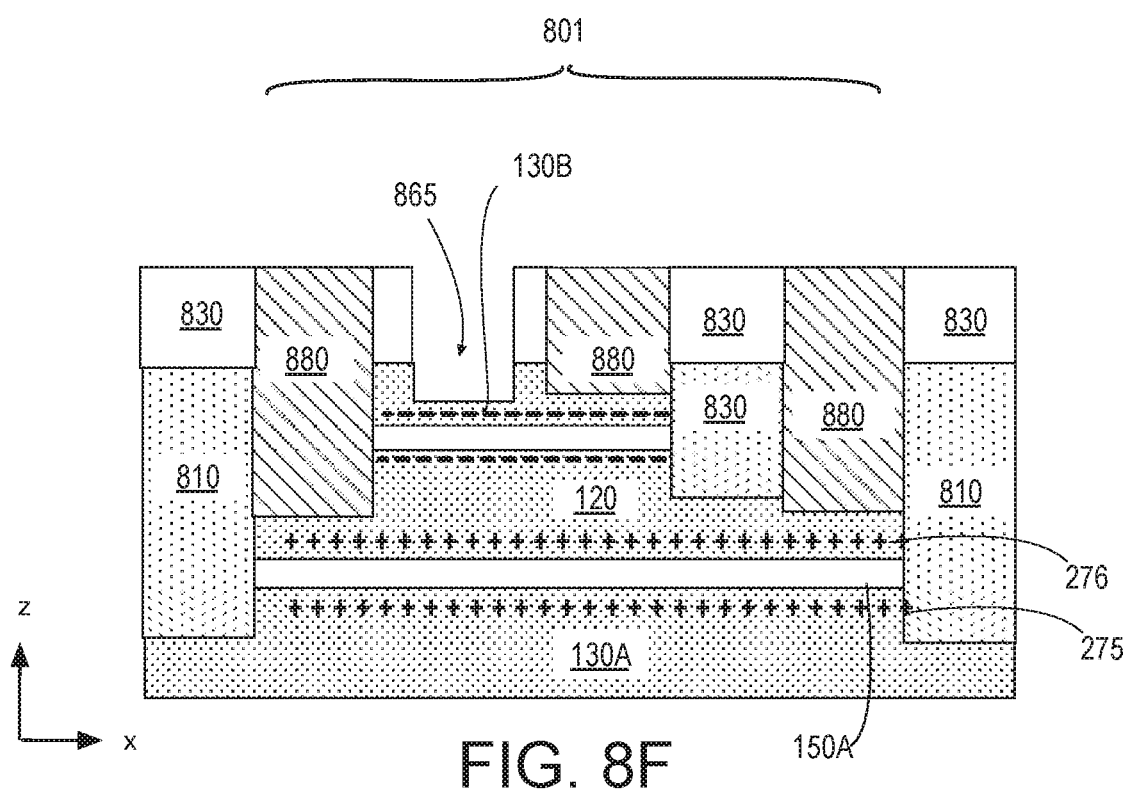

As illustrated in FIG. 8E, source and drain material 680 is deposited into the source or drain openings. Source and drain material 680 may have any of the compositions and/or other material properties described above. In some exemplary embodiments source and drain material 680 comprises III-N material with donor impurities (e.g., Si), which is capable of coupling to at least 2DEG 475 and 2DHG 276 (e.g., through a tunnel junction). Source and drain material 680 may be deposited by any deposition or epitaxial process known to be suitable for the material. A planarization process may follow the deposition process to planarize top surfaces of the source and drain material 860 with a top surface of ILD 830 and a top surface of gate mandrel 821 in preparation for gate replacement.

Returning to FIG. 7, methods 701 continue at operation 760 where the sacrificial gate mandrel is replaced with a permanent gate stack. The permanent gate stack may include any of the gate dielectric materials and gate electrode materials described above in the context of IC structure 605. In some embodiments, the permanent gate stack is operative for both the N-type and P-type transistor. Hence, the permanent gate stack may implement two vertically-stacked gates, one for each of the complementary transistors that are tied to one electrical potential. For such embodiments, the gate electrode of the permanent gate stack advantageously includes a mid-gap work function material that is suitable for modulating both a 2DEG and 2DHG. In the example shown in FIG. 8F sacrificial gate mandrel 821 has been removed, which exposes a top surface of fin 801 as well as a sidewall of both polarization junctions. In some embodiments, the gate replacement process further includes an isotropic etch of at least III-N material layer 120, which recesses the fin sidewalls sufficiently to ensure the presence of the permanent gate stack on the fin sidewall will fully deplete the charge carriers from both 2DHG 275 (276) and 2DEG 475 (476). Alternatively, such carrier depletion may only occur under non-zero gate bias conditions during transistor operation. In still other embodiments, the presence of the permanent gate stack may deplete carriers from one of 2DHG 275 (276) and 2DEG 475 (476) under zero gate bias while carriers from the other polarization junction are not depleted absent a non-zero gate bias during transistor operation.

Figure 8G:
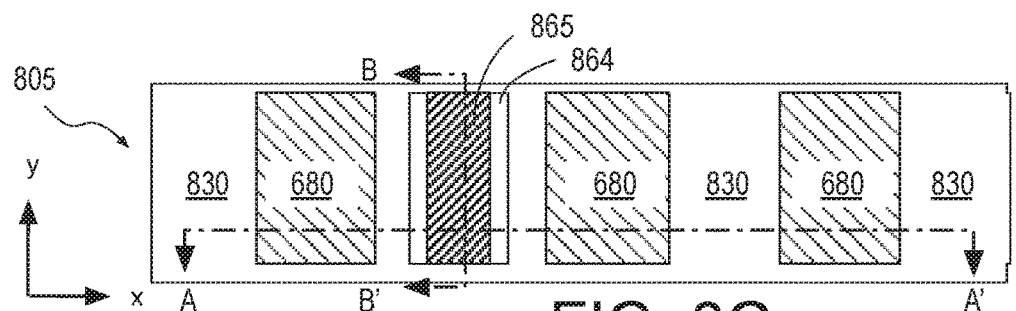
Figure 8H:
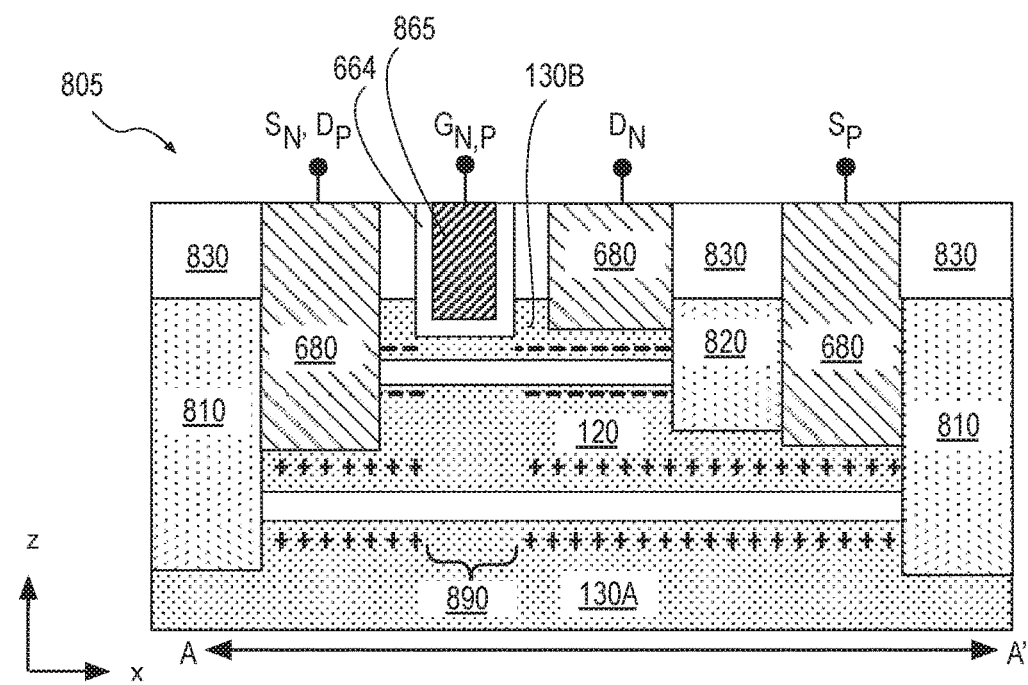
Figure 8I:
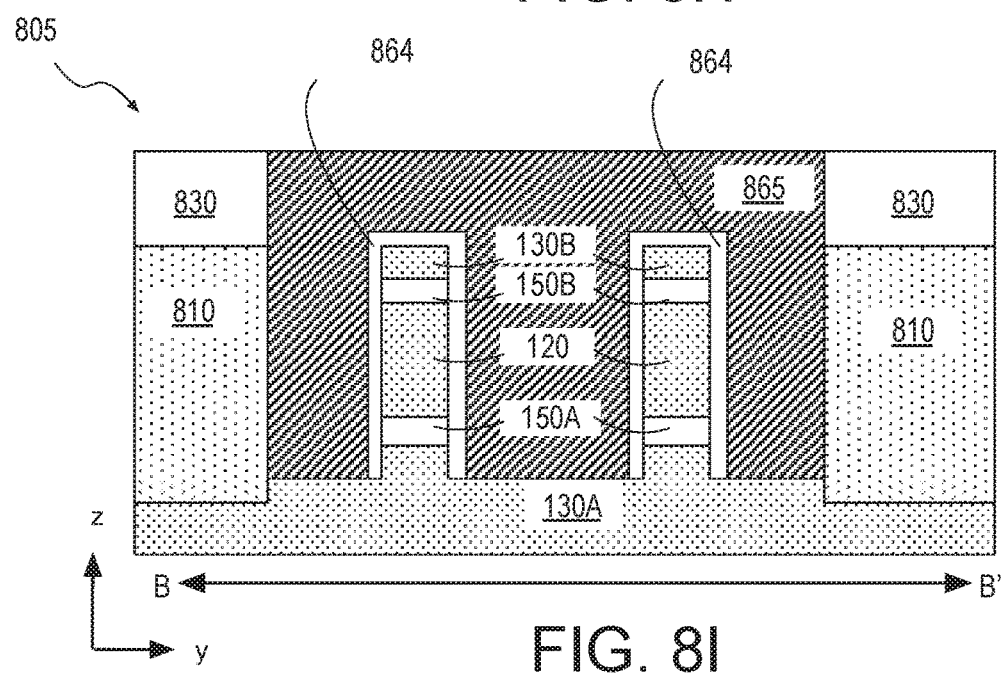

FIG. 8G is a plan view of an IC structure 805 following fabrication of a permanent gate stack including gate dielectric 664 and a gate electrode 865. FIG. 8H is a cross-sectional view of IC structure 805 along the A-A' line shown in FIG. 8G. FIG. 8I is a cross-sectional view of IC structure 805 along the B-B' line shown in FIG. 8G. As shown in FIG. 8I, gate dielectric 664 and gate electrode 865 is adjacent to a sidewall portion of the III-N layers 120 and 130B where both the polarization junctions reside. Hence, gate bias may modulate conductivity of both the 2DEG and 2DGH associated with each of the complementary polarization junctions. As shown in FIG. 8H and FIG. 8I, within stacked transistor channel 890, gate electrode 865 depletes carriers from both polarization junctions at zero gate bias voltage. Hence, the P-type transistor is in an "off" state with minimal conduction between the P-type transistor source terminal SP and P-type transistor drain terminal $D_P$. The N-type transistor is also in an "off" state with minimal conduction between the N-type transistor source terminal $S_N$ and N-type transistor drain terminal $D_N$. Depending on the gate threshold voltages associated with each of the complementary polarization junctions, one or both of the complementary polarization junctions may be populated with charge carriers, placing one or both of the P-type and N-type transistors into an "on" state.

FIG. 9 is a circuit schematic for integrated circuit structure 805, in accordance with some embodiments. As shown, IC structure 805 implements a static CMOS inverter with both a P-type transistor and a N-type transistor channel coupled to gate $G_{N,P}$. The P-type transistor has a source terminal $D_S$ coupled to a supply voltage (e.g., $V_{DD}$) and a drain terminal $D_P$ tied to the N-type transistor source terminal $S_N$. The N-type transistor has a drain terminal $D_N$ coupled to a reference potential (e.g., Vs).

Completing the discussion of FIG. 7, methods 701 end with interconnecting the stacked complementary transistors with one or more layers of interconnect metallization, for example to further integrate the CMOS inverter with other logic blocks of a CMOS circuit. One or more levels of ILD and interconnect metallization may be fabricated at operation 770. For embodiments where the P-type and N-type are to be monolithically integrated into a CMOS III-N IC, any known back-end-of-line (BEOL) processing may be performed at operation 770 to complete the IC. Following operation 770, an IC including III-N polarization junction CMOS transistors is substantially complete and may be singulated and packaged following any suitable techniques.

Figure 10:
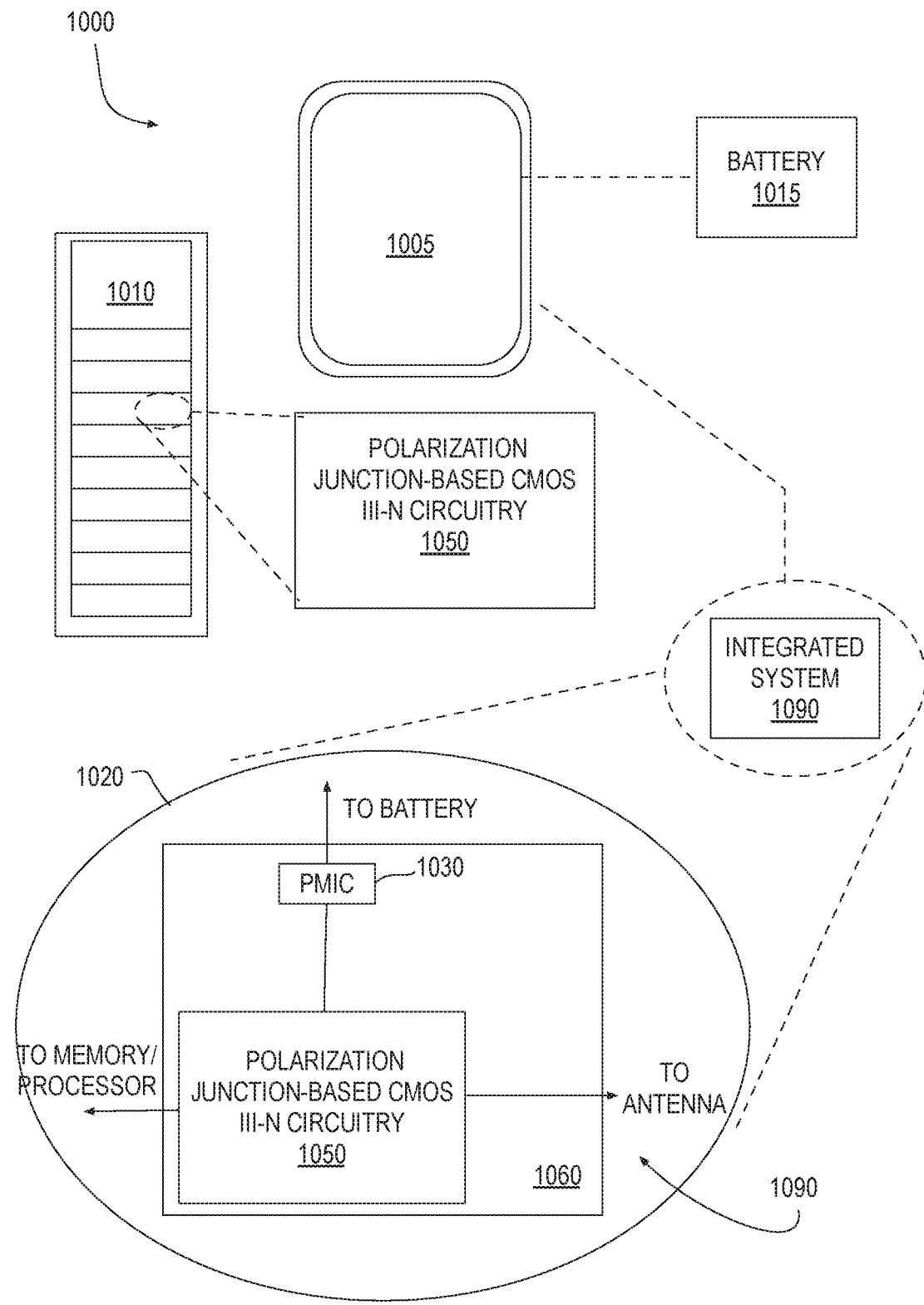
FIG. 10 illustrates a mobile computing platform and a data server machine including circuitry employing complementary III-N transistors, in accordance with embodiments.

FIG. 10 illustrates a system 1000 in which a mobile computing platform 1005 or a data server machine 1010 employs an circuitry including at least one III-N polarization junction light emitter, in accordance with some embodiments. The server machine 1010 may be any commercial server, for example including any number of high-performance computing platforms disposed within a rack and networked together for electronic data processing, which in the exemplary embodiment includes circuitry 1050. In accordance with mobile embodiments of system 1000, mobile computing platform 1005 may be any portable device configured for each of electronic data display, electronic data processing, wireless or optical electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level, or package-level integrated system 1090, and a battery 1015.

Whether disposed within the integrated system 1090 illustrated in the expanded view 1020, or as a stand-alone packaged chip within the server machine 1010, an IC includes complementary III-N transistors, each including a polarization junction, for example as described elsewhere herein. The circuitry 1050 may be further affixed to a board, a substrate, or an interposer 1060 along with a power management integrated circuit (PMIC). Functionally, PMIC 1030 may perform battery power regulation, DC-to-DC conversion, etc., and so has an input coupled to battery 1015 and with an output providing a current supply to other functional modules.

Circuitry 1050, in some embodiments, includes RF (wireless) integrated circuitry (RFIC) further including a wideband RF (wireless) transmitter and/or receiver (TX/RX transceiver including a digital baseband and an analog front end module comprising a power amplifier on a transmit path and a low noise amplifier on a receive path). The RFIC includes complementary III-N transistors, each including a polarization junction, for example as described elsewhere herein. The RFIC has an output coupled to an antenna (not shown) to implement any of a number of wireless standards or protocols, including but not limited to Wi-Fi (IEEE 802.10 family), WiMAX (IEEE 802.16 family), IEEE 802.20, long term evolution (LTE), Ev-DO, HSPA+, HSDPA+, HSUPA+, EDGE, GSM, GPRS, CDMA TDMA, DECT, Bluetooth, derivatives thereof, as well as any other wireless protocols that are designated as 3G, 4G, 5G, and beyond.

Figure 11:
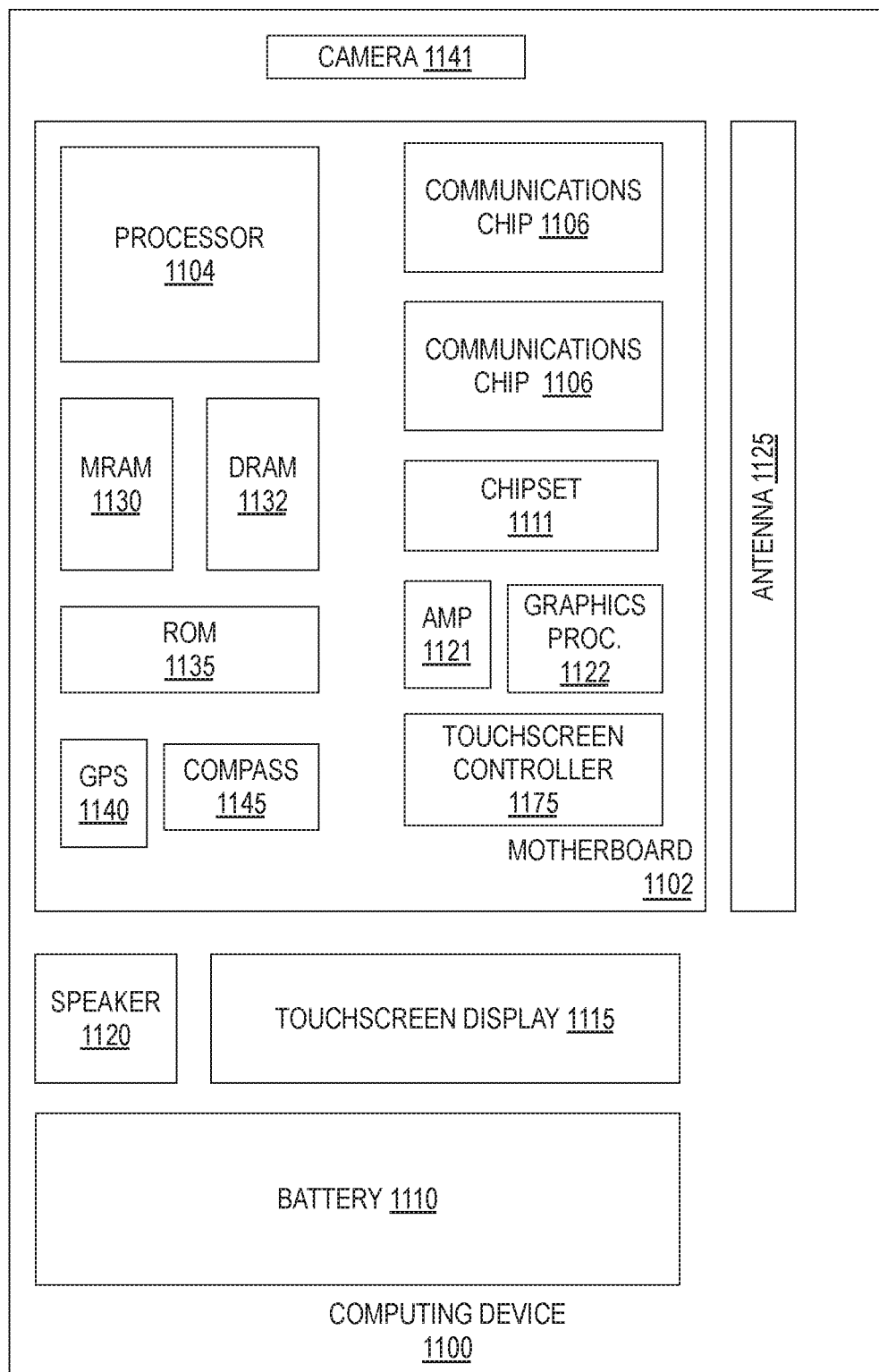
FIG. 11 is a functional block diagram of an electronic computing device, in accordance with some embodiments.

FIG. 11 is a functional block diagram of a computing device 1100, arranged in accordance with at least some implementations of the present disclosure. Computing device 1100 may be found inside platform 1005 or server machine 1010, for example. Device 1100 further includes a motherboard 1102 hosting a number of components, such as, but not limited to, a processor 1104 (e.g., an applications processor), which may further include complementary III-N transistors, each including a polarization junction, for example as describe elsewhere herein. Processor 1104 may for example include power management integrated circuitry (PMIC) that includes at least one III-N polarization junction diode. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., MRAM 1130, DRAM 1132), non-volatile memory (e.g., ROM 1135), flash memory, a graphics processor 1122, a digital signal processor, a crypto processor, a chipset, an antenna 1125, touchscreen display 1115, touchscreen controller 1175, battery 1110, audio codec, video codec, power amplifier 1121, global positioning system (GPS) device 1140, compass 1145, accelerometer, gyroscope, audio speaker 1120, camera 1141, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first examples, an integrated circuit (IC) structure comprises a first transistor including a first gate electrode over a first Group III-Nitride (III-N) polarization junction comprising a two-dimensional electron gas (2DEG), and a first source and a first drain coupled to the 2DEG on opposite sides of the first gate. The IC structure comprises a second transistor including a second gate electrode over a second III-N polarization junction comprising a two-dimensional hole gas (2DHG), and a second source and a second drain coupled to the 2DHG on opposite sides of the second gate.

In one or more second examples, for any of the first examples the first polarization layer comprises a first layer comprising a III-N material having a first crystal polarity, a second layer comprising a III-N material having a second crystal polarity, inverted from the first crystal polarity, and a first intervening layer between the first layer the second layer.

In one or more third examples, for any of the first through the second examples the first source and first drain comprise a III-N alloy and having a higher concentration of donor impurities than the third layer. A bottom of each of the first source and first drain is over an area of the 2DEG. The second source and second drain comprise the III-N alloy. A bottom of each of the second source and the second drain is over an area of the 2DHG.

In one or more fourth examples, for any of the first through the third examples the second polarization layer comprises a third layer comprising a III-N material having the first crystal polarity, and a second intervening layer between the first layer and the third layer.

In one or more fifth examples, for any of the first through the fourth examples the IC structure further comprises an isolation dielectric material between the first transistor and the second transistor, wherein the isolation dielectric material extends through both the first polarization junction and the second polarization junction.

In one or more sixth examples, for any of the fourth through the fifth examples a Group III-face of the first layer is adjacent to the first intervening layer and a Group III-face of the second layer is adjacent to the first intervening layer. A nitrogen (N)-face of the second layer is facing the second intervening layer. A N-face of the third layer is facing the N-face of the second layer.

In one or more seventh examples, for any of the fourth through the sixth examples a c-axis of the first, second and third layers is oriented substantially normal to a plane of the intervening layers with polar faces of the first, second, and third layers separated by the intervening layers.

In one or more eighth examples for any of the first through the seventh examples the first transistor is within a first region of the IC, and the second transistor is within a second region of the IC, laterally adjacent to the first region.

In one or more ninth examples, for any of the first through the eighth examples a top one of the first and second polarization junctions is over a bottom one of the first and second polarization junctions within the first region. The top one of the first and second polarization junctions is absent within the second region.

In one of more tenth examples, for any of the first through the ninth examples the first and second gate electrodes comprise a same metal, wherein the metal is over a sidewall of both the first and second polarization junctions.

In one or more eleventh examples, for any of the of second through the tenth examples at least the first and second layers comprise the same III-N material.

In one or more twelfth examples, for any of the second through the eleventh examples the first and second layer is binary GaN.

In one or more thirteenth examples, for any of the second through the twelfth examples the intervening layers each have a thickness no more than 5 nm.

In one or more fourteenth examples, for any of the second through the thirteenth examples the intervening layers each comprise oxygen and at least one of a metal, a rare earth, or a lanthanide.

In one or more fifteenth examples, a computer platform includes a processor, and one or more wireless transmitter coupled to the processor, wherein at least one of the processor and transmitter further comprise the IC structure of any one of the first through the fourteenth examples.

In one or more sixteenth examples, the computer platform further comprises a battery coupled to at least one of the processor and RF transceiver.

In one or more seventeenth examples, a method of forming an integrated circuit (IC) structure comprises receiving a substrate. The substrate comprises a first layer comprising a Group III-nitride (III-N) material of a first crystal polarity, a first intervening layer over the first layer, a second layer comprising a III-N material of a second crystal polarity, opposite the first crystal polarity, wherein the second layer is over the first intervening layer, a second intervening layer comprising oxygen over the second layer, and a third layer comprising a III-N material of the first polarity, wherein the third layer is over the second intervening layer. The method comprises forming an isolation structure between a first region and a second region of the substrate, wherein the isolation structure comprises a dielectric material. The method comprises exposing a surface of the second layer by removing the third layer and the second intervening layer within the second region of the substrate. The method comprises forming a first transistor over the third layer within the first region of the substrate. The method comprises forming a second transistor over the exposed surface of the second layer.

In one or more eighteenth examples, for any of the seventeenth examples forming the first transistor further comprises forming a first gate over the third layer within the first region of the substrate, and forming a first source and a first drain on opposite sides of the first gate, the first source and first drain each comprising a III-N alloy with donor impurities. Forming the second transistor further comprises forming a second gate over the exposed surface of the second layer, and forming a second source and a second drain on opposite sides of the second gate, the second source and second drain each comprising the III-N alloy with the donor impurities.

In one or more nineteenth examples, for any of the seventeenth through eighteenth examples the first transistor comprises a two-dimensional electron gas (2DEG) and the second transistor comprises a two-dimensional hole gas (2DHG).

In one or more twentieth examples, for any of the seventeenth through nineteenth examples the method comprises epitaxially growing the first layer over a crystal seed layer of the substrate, depositing, over the first layer, the first intervening layer, epitaxially growing the second layer over the first intervening layer, depositing, over the second layer, the second intervening layer, and epitaxially growing the third layer over the second intervening layer.

In one or more twenty-first examples, depositing the intervening layers further comprises epitaxially depositing a precursor material layer comprising Al, and oxidizing the precursor material layer.

In one or more twenty-second examples, a method of forming an integrated circuit (IC) structure comprises receiving a substrate, the substrate comprising a first III-N polarization junction comprising a two-dimensional electron gas (2DEG), and a second III-N polarization junction comprising a two-dimensional hole gas (2DHG). The method comprises defining a fin in the substrate that exposes a sidewall of the first and second polarization junctions. The method comprises defining an isolation structure within the fin that extends through the first polarization junction. The method comprises forming a gate electrode over at least the sidewall and on a first side of the isolation structure. The method comprises forming a first source or drain coupled to both the 2DEG and the 2DHG on a first side of a gate electrode, opposite the isolation structure. The method comprises forming a second source or drain coupled to a first of the 2DEG and the 2DHG between the gate electrode and the isolation structure. The method comprises forming a third source or drain coupled to a second of the 2DEG and the 2DHG on a second side of the isolation structure, opposite the second source or drain.

In one or more twenty-third examples, for any of the twenty-second examples the substrate comprises a first layer comprising a Group III-nitride (III-N) material of a first crystal polarity, a first intervening layer comprising oxygen over the first layer, a second layer comprising a III-N material of a second crystal polarity, opposite the first crystal polarity, wherein the second layer is over the first intervening layer. The substrate comprises a second intervening layer comprising oxygen over the second layer, and a third layer comprising a III-N material of the first polarity, wherein the third layer is over the second intervening layer.

In one or more twenty-fourth examples, for any of the twenty-second through twenty-third examples, forming the first source or drain comprises etching through the third layer and through a partial thickness of the second layer. Forming the second source or drain comprises etching through a partial thickness of the third layer. Forming the third source or drain comprises etching through the third layer and through a partial thickness of the second layer.

In one or more twenty-fifth examples, for any of the twenty-second through twenty-fourth examples forming the first, second, and third source and drain further comprises epitaxially growing a III-N alloy having a higher concentration of donor impurities than either second or third layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. An integrated circuit (IC) structure, comprising:
a first transistor including a first gate electrode over a first Group III-Nitride (III-N) polarization junction comprising a two-dimensional electron gas (2DEG), and a first source and a first drain coupled to the 2DEG on opposite sides of the first gate electrode; and
a second transistor including a second gate electrode over a second III-N polarization junction comprising a two-dimensional hole gas (2DHG), and a second source and a second drain coupled to the 2DHG on opposite sides of the second gate electrode.

2. The IC structure of claim 1 wherein the first polarization junction comprises:
a first layer comprising a III-N material having a first crystal polarity;
a second layer comprising a III-N material having a second crystal polarity, inverted from the first crystal polarity; and
a first intervening layer between the first layer the second layer.

3. The IC structure of claim 2, wherein:
a bottom of each of the first source and first drain is over an area of the 2DEG;
the second source and second drain comprise the III-N alloy; and
a bottom of each of the second source and the second drain is over an area of the 2DHG.

4. The IC structure of claim 2, wherein the second polarization junction comprises:
a third layer comprising a III-N material having the first crystal polarity; and a second intervening layer between the first layer and the third layer.

5. The IC structure of claim 4, further comprising an isolation dielectric material between the first transistor and the second transistor, wherein the isolation dielectric material extends through both the first polarization junction and the second polarization junction.

6. The IC structure of claim 4, wherein:
a Group III-face of the first layer is adjacent to the first intervening layer and a Group III-face of the second layer is adjacent to the first intervening layer;
a nitrogen (N)-face of the second layer is facing the second intervening layer; and
a N-face of the third layer is facing the N-face of the second layer.

7. The IC structure of claim 6, wherein a c-axis of the first, second and third layers is oriented substantially normal to a plane of the first and second intervening layers with the first and second intervening layers between polar faces of the first, second, and third layers.

8. The IC structure of claim 2, wherein:
at least the first and second layers comprise the same III-N material.

9. The IC structure of claim 2, wherein the first intervening layer comprises oxygen and at least one of a metal, a rare earth, or a lanthanide.

10. The IC structure of claim 2, wherein the first and second layers are binary GaN.

11. The IC structure of claim 1, wherein the first transistor is within a first region of the IC, and the second transistor is within a second region of the IC, laterally adjacent to the first region.

12. The IC structure of claim 11, wherein:
a top one of the first and second polarization junctions is over a bottom one of the first and second polarization junctions within the first region; and
the top one of the first and second polarization junctions is absent within the second region.

13. The IC structure of claim 1, wherein the first and second gate electrodes comprise a same metal, and wherein the metal is over a sidewall of both the first and second polarization junctions.

14. A computer platform including:
a processor; and
one or more wireless transmitters coupled to the processor, wherein at least one of the processor or transmitters further comprise the IC structure of claim 1.

15. The computer platform of claim 14 further comprising a battery coupled to at least one of the processor and wireless transmitters.

16. A method of forming an integrated circuit (IC) structure, the method comprising:
receiving a substrate, the substrate comprising:
a first layer comprising a Group III-nitride (III-N) material of a first crystal polarity;
a first intervening layer comprising oxygen over the first layer;
a second layer comprising a III-N material of a second crystal polarity, opposite the first crystal polarity, wherein the second layer is over the first intervening layer;
a second intervening layer comprising oxygen over the second layer, and
a third layer comprising a III-N material of the first crystal polarity, wherein the third layer is over the second intervening layer;
forming an isolation structure between a first region and a second region of the substrate;
exposing a surface of the second layer by removing the third layer and the second intervening layer within the second region of the substrate;
forming a first transistor over the third layer within the first region of the substrate; and
forming a second transistor over the exposed surface of the second layer.

17. The method of claim 16, wherein:
forming the first transistor further comprises:
forming a first gate over the third layer within the first region of the substrate; and
forming a first source and a first drain on opposite sides of the first gate, the first source and first drain each comprising a III-N alloy with donor impurities; and
forming the second transistor further comprises:
forming a second gate over the exposed surface of the second layer; and
forming a second source and a second drain on opposite sides of the second gate, the second source and second drain each comprising the III-N alloy with the donor impurities.

18. The method of claim 17, wherein the first transistor comprises a two-dimensional electron gas (2DEG) and the second transistor comprises a two-dimensional hole gas (2DHG).

19. The method of claim 17, further comprising:
epitaxially growing the first layer over a crystal seed layer of the substrate;
depositing, over the first layer, the first intervening layer;
epitaxially growing the second layer over the first intervening layer;
depositing, over the second layer, the second intervening layer; and
epitaxially growing the third layer over the second intervening layer.

20. The method of claim 17, wherein forming at least one of the first and second intervening layers further comprises:
epitaxially depositing a precursor material layer comprising Al; and
oxidizing the precursor material layer.

* * * * *